(12) United States Patent
Omori et al.

(10) Patent No.: US 11,594,853 B2
(45) Date of Patent: Feb. 28, 2023

(54) LIGHT SOURCE UNIT

(71) Applicant: NICHIA CORPORATION, Anan (JP)

(72) Inventors: Masaki Omori, Toshima-ku (JP);
Takashi Murayama, Yokohama (JP);
Norihiro Dejima, Yokohama (JP)

(73) Assignee: NICHIA CORPORATION, Anan (JP)

( * ) Notice: Subject to any disclaimer, the term of this patent is extended or adjusted under 35 U.S.C. 154(b) by 598 days.

(21) Appl. No.: 16/750,503

(22) Filed: Jan. 23, 2020

(65) Prior Publication Data
US 2020/0244037 A1 Jul. 30, 2020

(30) Foreign Application Priority Data

Jan. 24, 2019 (JP) .............................. JP2019-010068
May 22, 2019 (JP) .............................. JP2019-095837

(51) Int. Cl.
| | |
|---|---|
| *H01S 5/02251* | (2021.01) |
| *H01S 5/00* | (2006.01) |
| *G02B 6/42* | (2006.01) |
| *G02B 19/00* | (2006.01) |
| *G02B 27/30* | (2006.01) |
| *H01S 5/40* | (2006.01) |

(52) U.S. Cl.
CPC ............ *H01S 5/005* (2013.01); *G02B 6/4206* (2013.01); *G02B 19/0014* (2013.01); *G02B 19/0052* (2013.01); *G02B 27/30* (2013.01); *H01S 5/02251* (2021.01); *H01S 5/4012* (2013.01)

(58) Field of Classification Search
CPC ...... H01S 5/005; H01S 5/4012; G02B 6/4206; G02B 19/0014; G02B 19/0052; G02B 27/30
See application file for complete search history.

(56) References Cited

U.S. PATENT DOCUMENTS

| | | | |
|---|---|---|---|
| 7,733,932 B2 | 6/2010 | Faybishenko | |
| 7,817,705 B2 | 10/2010 | Shimada et al. | |
| 9,735,550 B2* | 8/2017 | Takahashi | H04N 9/3152 |
| 9,746,369 B2* | 8/2017 | Shpunt | G01S 7/4812 |
| 2003/0142720 A1 | 7/2003 | Bradburn et al. | |
| 2003/0210874 A1 | 11/2003 | Souda et al. | |
| 2003/0223680 A1 | 12/2003 | Li et al. | |
| 2014/0211466 A1 | 7/2014 | Dewa et al. | |
| 2017/0346254 A1 | 11/2017 | Baker et al. | |

(Continued)

FOREIGN PATENT DOCUMENTS

| | | |
|---|---|---|
| CN | 1447141 A | 10/2003 |
| CN | 1469143 A | 1/2004 |

(Continued)

*Primary Examiner* — Jennifer Doan
(74) *Attorney, Agent, or Firm* — Foley & Lardner LLP

(57) ABSTRACT

A light source unit includes: a sealed semiconductor laser package including a laser diode that includes an emitter region from which laser light is emitted, the emitter region located at a surface of the laser diode, and a window member configured to transmit the laser light; a first lens structure configured to receive the laser light transmitted through the window member and create an image of the emitter region on an image plane; and a second lens structure configured to convert the laser light having passed through the image plane into a collimated or converged beam, and to emit the collimated or converged beam.

20 Claims, 16 Drawing Sheets

(56) References Cited

U.S. PATENT DOCUMENTS

2018/0348451 A1    12/2018  Yamamoto et al.
2018/0359033 A1*   12/2018  Xu ........................ G02B 6/4204

FOREIGN PATENT DOCUMENTS

| | | |
|---|---|---|
| CN | 105826806 A | 8/2016 |
| EP | 1 215 784 A2 | 6/2002 |
| EP | 1 331 709 A1 | 7/2003 |
| EP | 1 906 495 A1 | 4/2008 |
| JP | H06-274931 A | 9/1994 |
| JP | 2004-004625 A | 1/2004 |
| JP | 2004-006641 A | 1/2004 |
| JP | 2008-089753 A | 4/2008 |
| JP | 2014-120560 A | 6/2014 |
| JP | 2016-136626 A | 7/2016 |

* cited by examiner

LIGHT SOURCE UNIT

CROSS-REFERENCE TO RELATED APPLICATION

This application claims priority to Japanese Patent Application No. 2019-010068, filed on Jan. 24, 2019, and Japanese Application No. 2019-095837, filed on May 22, 2019, the entire contents of which are hereby incorporated by reference.

BACKGROUND

The present disclosure relates to a light source unit.

High-power and high-radiance laser beams are used for performing processing such as cutting, punching, marking of various kinds of materials, or welding a metal material.

Some of the carbon dioxide gas laser devices and YAG solid laser devices that have conventionally been used for such laser processing are being replaced by fiber laser devices, which provide a high efficiency of energy conversion. Semiconductor laser diodes (hereinafter simply referred to as LD) are used for pumping light sources of fiber laser devices. In recent years, along with increase in the output of LDs, techniques in which LDs are used for light sources of a laser beam directly radiated to a material to process the material have been studied, instead of using LDs for pumping light sources. Such techniques are referred to as direct diode laser (DDL) technology.

U.S. Pat. No. 7,733,932 describes an example of a laser light source which combines a plurality of laser beams each emitted from a respective one of a plurality of LDs, to increase the light output. Such combining of a plurality of laser beams is referred to as "spatial beam combining", and can be utilized to enhance the light output of a pumping light source of a fiber laser or a DDL devices or the like.

SUMMARY

There is a demand for a laser light source having higher reliability that is suitable for spatial beam combining, and a laser processing device having such a laser light source.

According to one embodiment, a light source unit includes: a sealed semiconductor laser package including: a laser diode including an emitter region from which laser light is emitted, the emitter region located at a surface of the laser diode, and a window member configured to transmit the laser light; a first lens structure configured to receive the laser light transmitted through the window member and create an image of the emitter region on an image plane; and a second lens structure configured to convert the laser light having passed through the image plane into a collimated or converged beam, and to emit the collimated or converged beam.

According to certain embodiments, a novel light source unit that is suitable for spatial beam combining can be provided.

DETAILED DESCRIPTION

Before describing embodiments of the present disclosure, findings that were made by the inventors and a technological background thereof will be described.

Figure 1A:
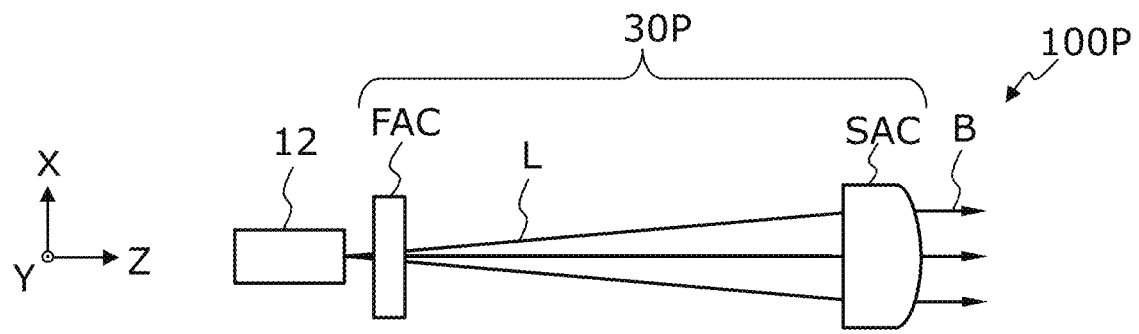
FIG. 1A is a top view schematically showing an example structure of a conventional light source unit 100P configured to collimate and outputs laser light that is emitted from an LD in chip form.
Figure 1B:
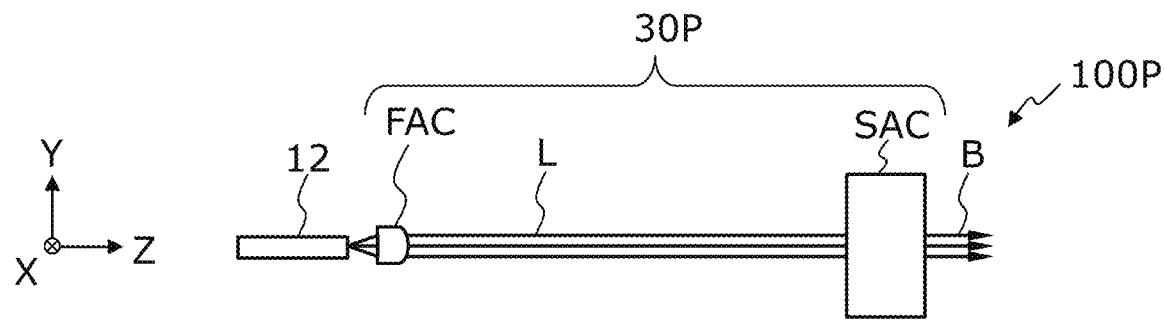
FIG. 1B is a side view of an example structure of the light source unit 100P shown in FIG. 1A.

FIG. 1A is a top view schematically showing an example structure of a conventional light source unit 100P configured to collimate and output laser light that is emitted from an LD in chip form, and FIG. 1B is a side view thereof. For the sake of reference, an XYZ coordinate system that is based on an X axis, a Y axis, and a Z axis that are orthogonal to one another, is schematically shown in the attached drawings.

The light source unit 100P shown in FIGS. 1A and 1B includes an LD 12 configured to emit laser light L, and an optical system 30P configured to collimate the laser light L. In the example shown in FIGS. 1A and 1B, the optical system 30P includes a fast-axis collimator lens FAC and a slow-axis collimator lens SAC, which are located on the optical axis in this order from the LD 12 side, such that the fast-axis collimator lens FAC is located closer to the LD 12 than is the slow-axis collimator lens SAC. The fast-axis collimator lens FAC and the slow-axis collimator lens SAC are both cylindrical lenses (e.g. cylindrical planoconvex lenses). The cylindrical lens has a curved surface to converge a parallel bundle of rays onto an imaginary straight line (focal point). The curved surface has a shape corresponding to a portion of the outer peripheral surface of a circular cylinder, with a curvature of zero in a direction corresponding to an axial direction of the corresponding circular cylinder. A plurality of light source units 100P each having the illustrated construction may be used to perform spatial beam combining. Details of spatial beam combining will be described below.

Figure 2:
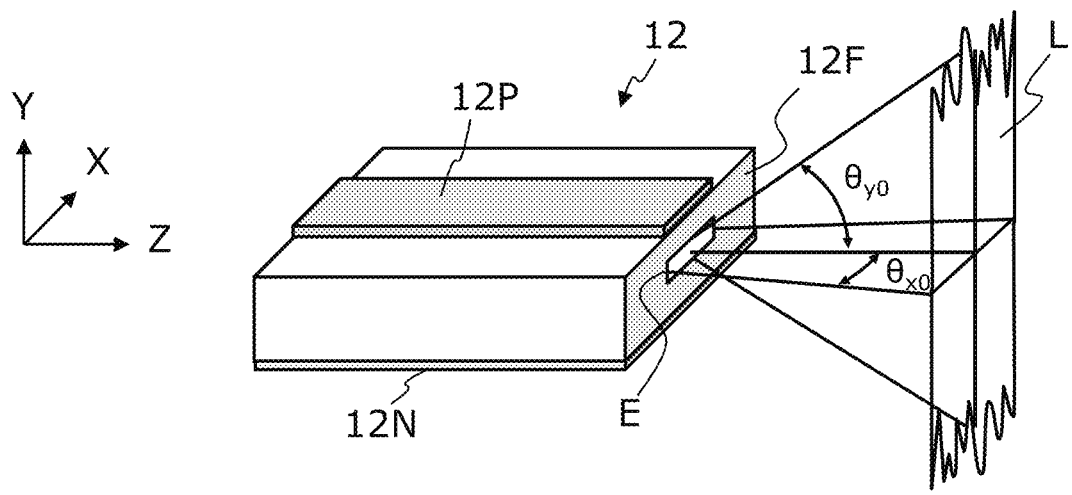
FIG. 2 is a perspective view showing an example of the basic structure of the LD 12.

FIG. 2 is a perspective view schematically showing an example of the basic structure of the LD 12. The illustrated structure is simplified for explanation. In the example of FIG. 2, the LD 12 includes a stripe-shaped p-electrode 12P on an upper surface of the LD 12, an n-electrode 12N on a lower surface of the LD 12, and an emitter region E on an end surface 12F of the LD 12. The laser light L is emitted from the emitter region E. The LD 12 includes a semiconductor substrate and a plurality of semiconductor layers (a semiconductor multilayer structure) that are grown on the semiconductor substrate. The semiconductor multilayer structure includes an emission layer that emits light through laser oscillation, and may have various known configurations. The LD 12 in this example is a broad-area type laser diode, and has the emitter region E with a size along the X axis direction (e.g. 50 μm or more) much larger than a size of the emitter region E along the Y axis direction (e.g. about 2 μm). The size of the emitter region E along the Y-axis direction is determined according to the semiconductor multilayer structure (or specifically, thicknesses of the waveguide and the cladding layers, refractive index ratio, etc.) of the LD 12. The size of the emitter region E along the X-axis direction is determined according to the X-axis size of a region in which an electric current flows in a direction crossing the emission layer, more specifically, the width (gain waveguide width) of a ridge structure (not shown in drawings), etc.

As shown in FIG. 2, the beam shape of the laser light L that is emitted from the emitter region E is asymmetric between the X axis direction and the Y axis direction. A far field pattern of the laser light L is schematically shown in FIG. 2. The laser light L has a beam shape that approximates a single-mode Gaussian beam along the Y axis direction, while having a multi-mode beam shape with a small divergence angle as a whole along the X axis direction. The divergence half angle $\theta_{y0}$ along the Y axis direction is greater than the divergence half angle $\theta_{x0}$ along the X axis direction. With the laser light L that can be approximated to a Gaussian beam along the Y axis direction, given a beam radius $\omega_o$ at the beam waist along the Y axis direction and a wavelength λ of the laser light L, then $\theta_{y0} = \tan^{-1}(\lambda/\pi\omega_o) \approx \lambda/(\pi\omega_o)$ radians is satisfied. In the case of a broad-area type laser diode with λ in the visible light region, for example, $\theta_{y0}$ may be 20 degrees and $\theta_{x0}$ may be 5 degrees. With such divergence half angles, during propagation along the Z axis direction, the size of the laser light L along the Y-axis directions is increased while the laser light L diverges relatively "fast." Accordingly, the Y axis is called "the fast axis", and the X axis is called "the slow axis." The laser light L has a multimode shape along the slow-axis direction, and accordingly the beam quality along the slow-axis direction is deteriorated relative to the beam quality along the fast-axis direction. Accordingly, the BPP (Beam Parameter Product) determining beam quality is larger along the slow-axis direction, than along the fast-axis direction. BPP is a multiplication product between the beam waist radius and the divergence half angle in a far field.

In the illustrated example, the Z axis is parallel to the propagation direction (beam center axis) of the laser light L that is emitted from the LD 12. When explaining the operation of a single LD, it would be convenient if the origin of the XYZ coordinate system coincided with the center of the emitter region E. However, when explaining spatial beam combining with regard to a plurality of LDs, it is not necessary for the origin of the XYZ coordinate system to be related to a specific one of the LDs. Moreover, the orientations of the plurality of LDs used for spatial beam combining do not need to be parallel to one another; in some cases, each laser beam may be reflected by a different mirror to change its propagation direction. Therefore, in the present disclosure, the terms "fast-axis direction" and "slow-axis direction" may not necessarily mean being parallel to the "Y axis direction" and the "X axis direction" in the global XYZ coordinate system, respectively, but may be determined based on the asymmetry in beam quality of each of the laser beams. In other words, in a cross section that is orthogonal to the propagation direction of a laser beam, the direction along which BPP is the lowest is "the fast axis", and the direction that is orthogonal to the fast axis is "the slow axis."

FIG. 1A and FIG. 1B are referred to again. In these figures, for simplicity, the laser light L and the collimated beam B are each schematically represented by three rays. Among the three rays, the middle ray is on the optical axis of the lens, while the other two rays schematically indicate the beam diameter. The beam diameter may be defined by the size of a region having a light intensity of e.g. $1/e^2$ or more relative to the light intensity in the beam center.

Herein, e is Napier's constant (about 2.71). The beam diameter and the beam radius may alternatively be defined according to other criteria.

As shown in FIG. 1B, the fast-axis collimator lens FAC is configured to collimate the laser light L in a plane (YZ plane) that contains the propagation direction (the Z axis) of the laser light L and the fast-axis direction (the Y axis). As shown in FIG. 1A, the slow-axis collimator lens SAC is configured to collimate the laser light L in a plane (XZ plane) that contains the propagation direction (the Z axis) and the slow-axis direction (the X axis). In order to perform such collimations, the fast-axis collimator lens FAC and the slow-axis collimator lens SAC are disposed such that the center of the emitter region E is located at their respective front focal points.

As schematically shown in FIG. 2, in a near field, the laser light L has a cross section with a shape shorter along the fast-axis direction than along the slow-axis direction, thus being consistent with the shape of the emitter region E. However, because the divergence half angle along the fast-axis direction is large, the size of the cross section of laser light L along the fast-axis direction greatly increases in a direction away from the emitter region E. Accordingly, a cross section of the collimated beam B after passing through the optical system 30P has a shape and a size according to the positions of the fast-axis collimator lens FAC and the slow-axis collimator lens SAC along the optical path of the laser light L. More specifically, the fast-axis size of the collimated beam B is determined by the divergence half angle $\theta_{y0}$ along the fast-axis direction (or the numerical aperture of the fast-axis collimator lens FAC) and the focal length of the fast-axis collimator lens FAC. Similarly, the slow-axis size of the collimated beam B is determined by the divergence half angle $\theta_{x0}$ along the slow-axis direction (or the numerical aperture of the slow-axis collimator lens SAC) and the focal length of the slow-axis collimator lens SAC.

In general, the closer the fast-axis collimator lens FAC is disposed to the end surface 12F, more specifically, to the emitter region E, of the LD 12, the smaller the fast-axis size of the collimated beam B can be. In other words, the farther the fast-axis collimator lens FAC is from the end surface 12F of the LD 12 (emitter region E), the greater the fast-axis size of the collimated beam B. Similarly, the farther the slow-axis collimator lens SAC is from the end surface 12F of the LD 12 (emitter region E), the greater the slow-axis size of the collimated beam B. When changing the positions of the fast-axis collimator lens FAC and the slow-axis collimator lens SAC along the optical path of the laser light L, the aperture and the focal length of the collimator lenses FAC and SAC need to be changed as appropriate. The center of the emitter region E is placed at the respective front focal points of the collimator lenses FAC and SAC.

When spatial beam combining is performed using a plurality of light source units 100P of the structure described above, if LDs 12 having an oscillation wavelength that is shorter than the near-infrared region are used and light output of the LDs 12 is increased, dust or the like in the atmosphere may adhere to the emitter region E during operation due to an optical dust-attracting effect, which may cause reduction in the light output. Substances other than dust may adhere to the emitter region, and a deposit generated by chemical reactions of volatilized organic matter with the laser light L. The shorter the wavelength of the laser light L and the higher the light output, the greater the deteriorations associated with the adhered matter. In order to avoid this problem, a technique is considered in which, when accommodating the plurality of LDs 12 in a housing, the housing is assembled such that dust will not enter the housing, and then the housing is sealed. However, dust or the like may adhere to the lens structure, mirrors, or other parts that are necessary for spatial beam combining, and it is difficult to enhance airtightness of the entire housing. Accordingly, it has been found difficult to maintain a high light output over long periods of time using this technique.

In another technique for avoiding the problem, each LD 12 may be accommodated within a sealed semiconductor laser package. There exists highly advanced packaging technology for LDs, which allows highly-reliable operation over long periods of time. However, when the LDs 12 are accommodated in a semiconductor laser package, even if the fast-axis collimator lens FAC are to be brought close to the emitter region E of each LD 12, physical interference with the semiconductor laser package may prevent the fast-axis collimator lens FAC and the emitter region E of each LD 12 from being sufficiently close to each other, and accordingly it is necessary to employ a fast-axis collimator lens FAC that has a relatively long focal length. This will be described below in detail.

Figure 3A:
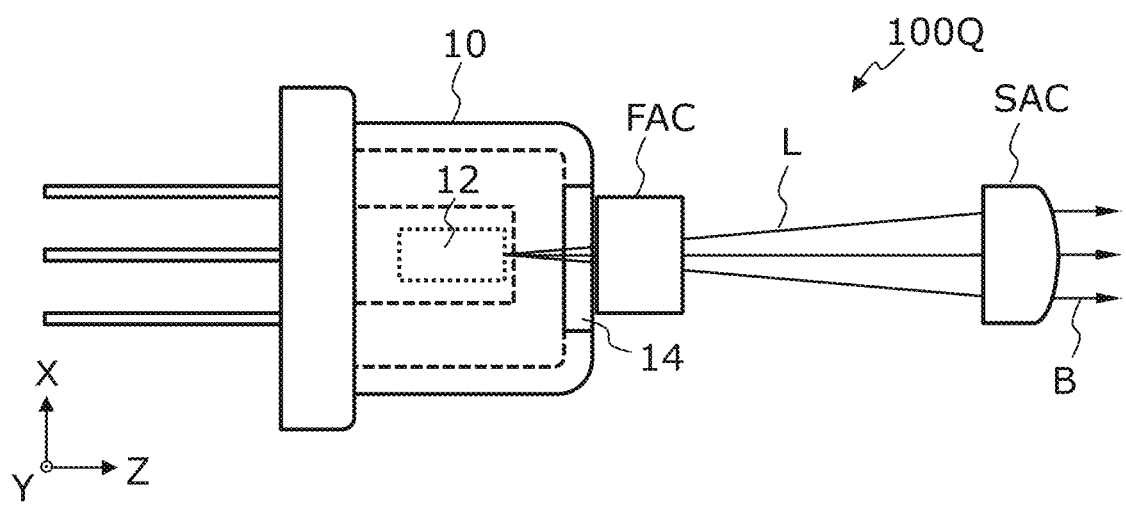
FIG. 3A is a schematic cross-sectional view showing an example structure of a light source unit 100Q configured to collimate and output laser light that is emitted from an LD 12 accommodated in a package 10, taken parallel to the XZ plane.
Figure 3B:
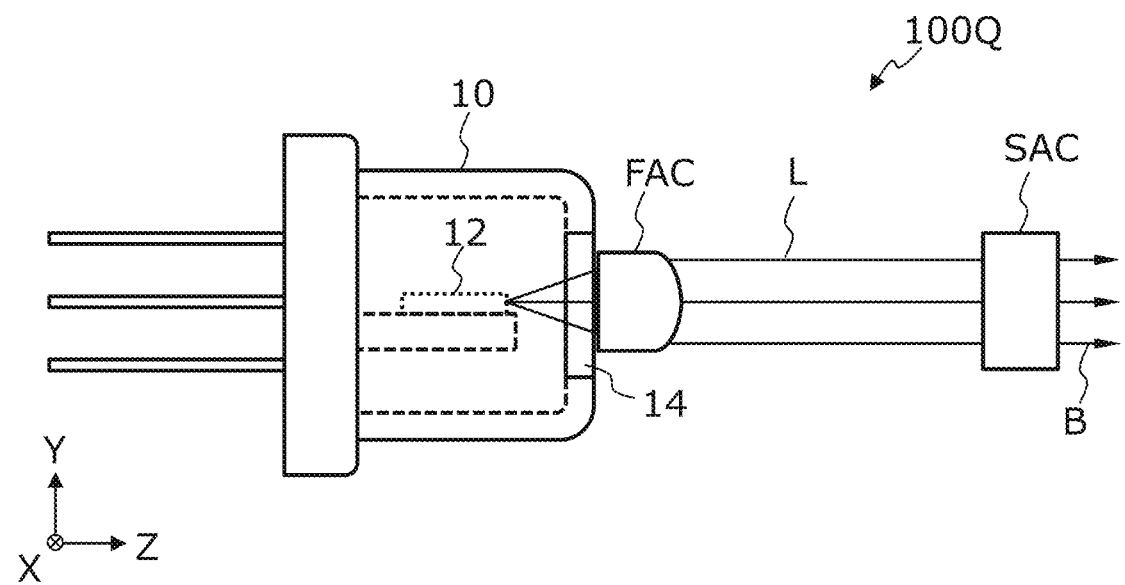
FIG. 3B is a schematic cross-sectional view of the light source unit 100Q shown in FIG. 3A, taken parallel to the YZ plane.

FIG. 3A is a schematic cross-sectional view showing an example structure of a light source unit 100Q configured to collimate and output laser light that is emitted from an LD 12 accommodated in a semiconductor laser package 10, taken parallel to the XZ plane. FIG. 3B is a schematic cross-sectional view thereof, taken parallel to the YZ plane. Hereinafter, the semiconductor laser package may be simply referred to as a "package."

As can be seen from FIGS. 3A and 3B, a window member 14 of the package 10 is located between the emitter region E of the LD 12 and the fast-axis collimator lens FAC, preventing the fast-axis collimator lens FAC from being located any closer to the emitter region E of the LD 12 than in the configuration illustrated in 3A and 3B. In the case of the aforementioned light source unit 100P, the distance from the emitter region E of the LD 12 to the fast-axis collimator lens FAC can be, for example, 0.3 millimeters (mm). On the other hand, the distance between the emitter region E of the LD 12 accommodated in the package 10 to the fast-axis collimator lens FAC (which refers to the "optical length", to be described below) may increase to about 1.5 mm, for example. Because the center of the emitter region E needs to be located at the front focal point of the fast-axis collimator lens FAC, the focal length of the fast-axis collimator lens FAC needs to be increased, which causes an increase in the size of the collimated beam B along the fast axis (the Y axis) by several times. Increase in the size of the collimated beam B along the fast-axis direction may cause disadvantages such as an increase in the size of the convergent optical system used for performing spatial beam combining. Details of such disadvantages will be described below.

Configurations in embodiments of the present disclosure allow for solving such problems. Hereinafter, an example of the basic structure of a light source unit 100 according to an embodiment of the present disclosure will be described.

Light Source Unit

Figure 4:
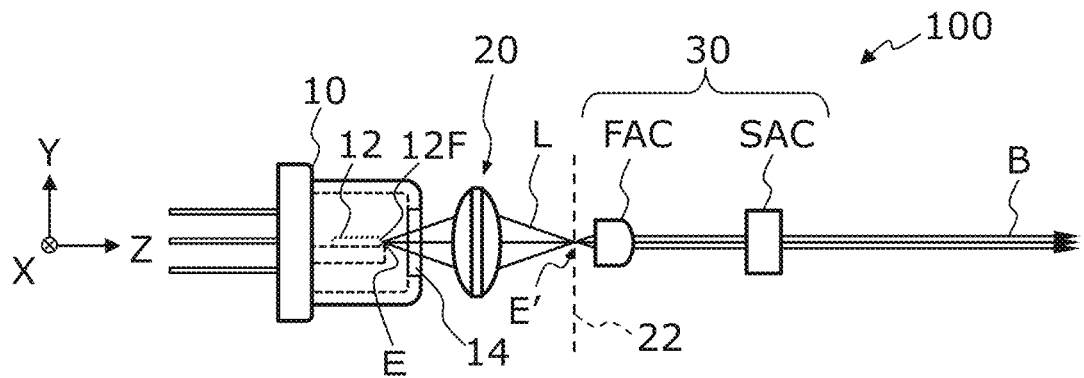
FIG. 4 is a diagram showing an example of the basic structure of the light source unit 100 according to one embodiment.
Figure 5:
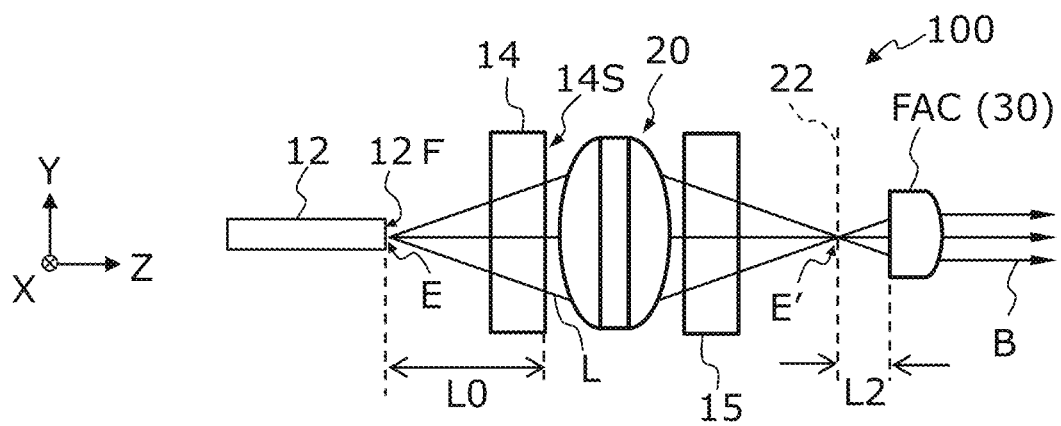
FIG. 5 is a diagram showing a main portion of the light source unit 100.

FIG. 4 is a diagram showing an example of the basic structure of the light source unit 100 according to the present embodiment. FIG. 5 is a schematic diagram of a main part of the light source unit 100. In the example in FIG. 5, the light source unit 100 includes a sealed package 10, a first lens structure 20, and a second lens structure 30.

The package 10 includes: an LD 12 that has an emitter region E to emit laser light L at an end surface 12F; and a window member 14 that transmits the laser light L. Any appropriate structure may be employed for the package 10, and for example, the package 10 may be a TO-CAN type package of Φ5.6 mm or Φ9 mm. The package 10 includes a stem having a lead terminal and a metal cap covering the LD that has been secured to the stem, and the light-transmitting window member 14 is attached to the metal cap. An example of the window member 14 is a thin plate made of optical glass (refractive index: 1.4 or more). The inside of the package 10 is filled with an inert gas, e.g., a nitrogen gas of high cleanliness or a noble gas, and the package 10 may be sealed airtight. The LD 12 may be a semiconductor laser element that outputs laser light of near-ultraviolet, violet, blue, or green, the semiconductor laser element being made of a nitride semiconductor-based material, for example. Specifically, the oscillation wavelength (central wavelength) of the LD 12 is in the range of 350 nm to 550 nm, for example. The LD 12 may be fixed to the stem via a submount having a high thermal conductivity. The LD 12 may be disposed in any appropriate orientation other than that in FIGS. 4 and 5, and the LD 12 may be disposed such that laser light emitted from the LD 12 is reflected along the Z axis direction by a mirror within the package.

The first lens structure 20 receives the laser light L having been transmitted through the window member 14, and creates an image E' of the emitter region E on an image plane 22. In the example shown in FIG. 5, a second window member 15 having a structure and size similar to those of the window member 14 is disposed on the optical path of the first lens structure 20. The second window member 15 is disposed at a position symmetric to the position of the window member 14 with respect to the first lens structure 20. The image plane 22 is a plane at which rays emitted from locations in the emitter region E are converged through refraction of the first lens structure 20 to form an image. The emitter region E and the image E' on the image plane 22 are located at conjugate positions, or at positions near conjugate positions. In certain embodiments of the present disclosure, the optical axis of the laser light L passing through the center of the emitter region E coincides with the optical axis of the first lens structure 20. In the present disclosure, among planes that are perpendicular to the optical axis of the first lens structure 20, a plane that extends through the center of a location at which rays emitted from the center of the emitter region E are converged by the first lens structure 20 is referred to as the "image plane." If a screen were placed at the image plane 22, the image E' of the emitter region E would form on that screen. However, because no screen is actually placed on the image plane 22, the image E' functions as an imaginary light source that is located in free space. Such an imaginary light source may be referred to as an intermediate image, a reproduced image, or a transferred image of the emitter region E. The second window member 15 compensates for the influence of the window member 14 exerted on the laser light L image, and contributes to the shape of the emitter region E being accurately reproduced by the shape of the image E' that is created on the plane 22. The first lens structure 20 may not include the second window member 15, but it is preferable that the first lens structure 20 includes the second window member 15 or an optical member that can function as the second window member 15.

The second lens structure 30 is configured to convert the laser light L having passed through the image plane 22 into a collimated beam B or a convergent beam, and emits the converted light. The second lens structure 30 receives the light from the image (imaginary light source) E' of the emitter region E located at the image plane 22, and accordingly the focal length of the second lens structure 30 can be reduced without being affected by physical constraints (interference) associated with the structure of the package 10.

In FIG. 5, a distance L0 between the end surface 12F of the LD 12 and an outer surface 14S of the window member 14 and a distance L2 between the image plane 22 and the second lens structure 30 are shown. In the example shown in FIG. 5, the fast-axis collimator lens FAC of the second lens structure 30 is disposed so that L0>L2. Thus, as compared to the case where the structure of the package 10 imposes some physical constraints, the focal length of the second lens structure 30 (or specifically, the fast-axis collimator lens FAC) can be reduced, and the diameter of the collimated beam B reduced. The "distance" as used in "distance L0" and "distance L2" refers to an optical length. The optical length is a value obtained by integrating n·ds, which is a product of the line element ds and the refractive index n, along the ray path. The optical length may also be referred to as "optical distance" or "optical path length." Even with the same thickness of the window member 14, the distance L0 may be varied according to the refractive index of the window member 14. Because the refractive index of the window member 14 is higher than the refractive index (about 1.0) of air, the optical length can be substantially increased due to presence of the window member 14. The thickness of the window member 14 is generally about 0.25 mm. In the case where the window member 14 is made of glass having a refractive index of 1.52, for example, an optical length of 0.38(=0.25×1.52) mm can be obtained by the window member 14. Furthermore, a predetermined gap exists between the LD 12 and the window member 14, possibly increasing the distance L0 to 1.0 mm or more. The distance between the image plane 22 and the second lens structure 30 refers to an optical length between the image plane 22 and a surface of one or more optical elements, such as a lens(es), in the second lens structure 30 closest to the image plane 22. In the present embodiment, the distance L2 between the image plane 22 and the second lens structure 30 corresponds to the "front focal length", "working distance", and the "BFL (Back Focal Length)" of the fast-axis collimator lens FAC.

According to the present embodiment, the distance L2, i.e., the "front focal length" of the fast-axis collimator lens FAC, can be 1.0 mm or less, and generally 0.8 mm or less, or even possibly 0.5 mm or less (e.g. about 0.3 mm). Thus, while accommodating the LD 12 inside the sealed package 10, the size of the collimated beam B along the fast axis (the Y axis) direction can be kept small. As a result, without increasing the size of the optical system for convergence in performing spatial beam combining, it is possible to enhance reliability over long periods of time.

Figure 6:
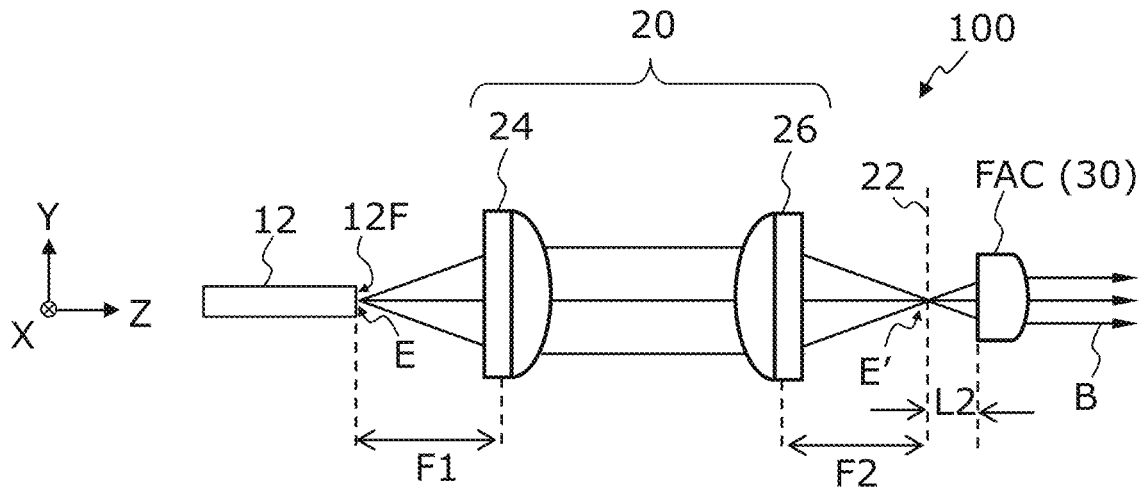
FIG. 6 is a diagram showing an implementation in which a first lens structure 20 includes an objective lens structure 24 and an imaging lens structure 26.

The first lens structure 20 does not need to be composed of one single-lens, but may be composed of a compound lens. As shown in FIG. 6, the first lens structure 20 may be a relay lens that includes an objective lens structure 24 and an imaging lens structure 26. By using the objective lens structure 24 and the imaging lens structure 26, an infinity corrected optical system can be established. Each of the objective lens structure 24 and the imaging lens structure 26 may also be a compound lens that is a combination of simple lenses of different shapes. Using a compound lens allows for reducing aberrations, so that deteriorations in beam quality can be reduced.

In the example of FIG. 6, the emitter region E of the LD 12 is located at the front focal point of the objective lens structure 24. The image plane 22 is located at the back focal point of the imaging lens structure 26. In certain embodiments of the present disclosure, an effective focal length F2 of the imaging lens structure 26 is equal to or greater than an effective focal length F1 of the objective lens structure 24. The "effective focal length" as used herein refers to the distance between the principal point to the focal point of a lens. The lateral magnification of the image that is created on the image plane 22 is F2/F1, and accordingly the size of the image E' of the emitter region E at the image plane 22 is F2/F1 times of the size of the emitter region E. If F2 is greater than F1, an enlarged image E' of the emitter region E will function as an imaginary light source. Provided that the size of the imaginary light source along the fast-axis direction, i.e., the fast-axis direction beam diameter at the image plane 22, is $2\times\omega_{y1}$, the fast-axis direction divergence half angle (divergence half angle in a far field) of a beam that is emitted from the imaginary light source is $\theta_{y1}$, the fast-axis size of the actual emitter region E, i.e., the fast-axis direction beam diameter at the emitter region E, is $2\times\omega_{y0}$, and the fast-axis direction divergence half angle (divergence half angle in a far field) of a beam emitted from the emitter region E is $\theta_{y0}$, the relationship $\omega_{y0}\times\theta_{y0}=\omega_{y1}\times\theta_{y1}$ can be satisfied under conditions in which beam quality is not deteriorated. Therefore, if F2/F1 is greater than 1, $\omega_{y1}$ is greater than $\omega_{y0}$, then $\theta_{y1}$ is smaller than $\theta_{y0}$. This allows for reducing the numerical aperture of the second lens structure 30 (the fast-axis collimator lens FAC and the slow-axis collimator lens SAC), and increasing the effective focal length. The technological significance thereof will be described below.

Optical systems other than an optical system configured to emit a collimated beam may be employed for the second lens structure 30, but the second lens structure 30 may also be an optical system configured to emit a converged beam.

In the present embodiment, the distance L2 between the image plane 22 and the second lens structure 30 is the distance between the image plane 22 and the fast-axis collimator lens FAC. As used herein, the "distance between the image plane 22 and the fast-axis collimator lens FAC" refers to an optical length between the image plane and a surface of the fast-axis collimator lens FAC closest to the image plane 22. Using the fast-axis collimator lens FAC and the slow-axis collimator lens SAC instead of using any aspherical lenses allows for performing appropriate collimation for each of the fast axis and the slow axis. According to certain embodiments of the present disclosure, with the fast-axis collimator lens FAC disposed near the image plane 22, the effective focal length of the fast-axis collimator lens FAC can be reduced, and the fast-axis size of the collimated beam B can be reduced.

In certain embodiments of the present disclosure, in the case in which the second lens structure 30 includes the fast-axis collimator lens FAC and the slow-axis collimator lens SAC being located in this order from the image plane 22 such that the fast-axis collimator lens FAC is closer to the image plane 22, the effective focal length EFL of the fast-axis collimator lens FAC may be set to 1.0 mm or less, so that the fast-axis size of the collimated beam B can be e.g. 1.0 mm or less (e.g. about 0.8 mm). Reduction in the fast-axis size of the collimated beam B allows for reducing a size of the optical system and device (beam combiner) for spatially combining a plurality of collimated beams B.

An aperture stop may be disposed at the position of the image plane 22. The aperture stop can block unwanted light around the emitter image E' functioning as an imaginary light source. When the collimated beam B is incident on an optical fiber, the coherent light that is not needed for fiber coupling (i.e., coherent light that emerges outside of the Airy disk d) will be removed by the function of such an aperture stop.

Laser Light Source Module

Figure 7A:
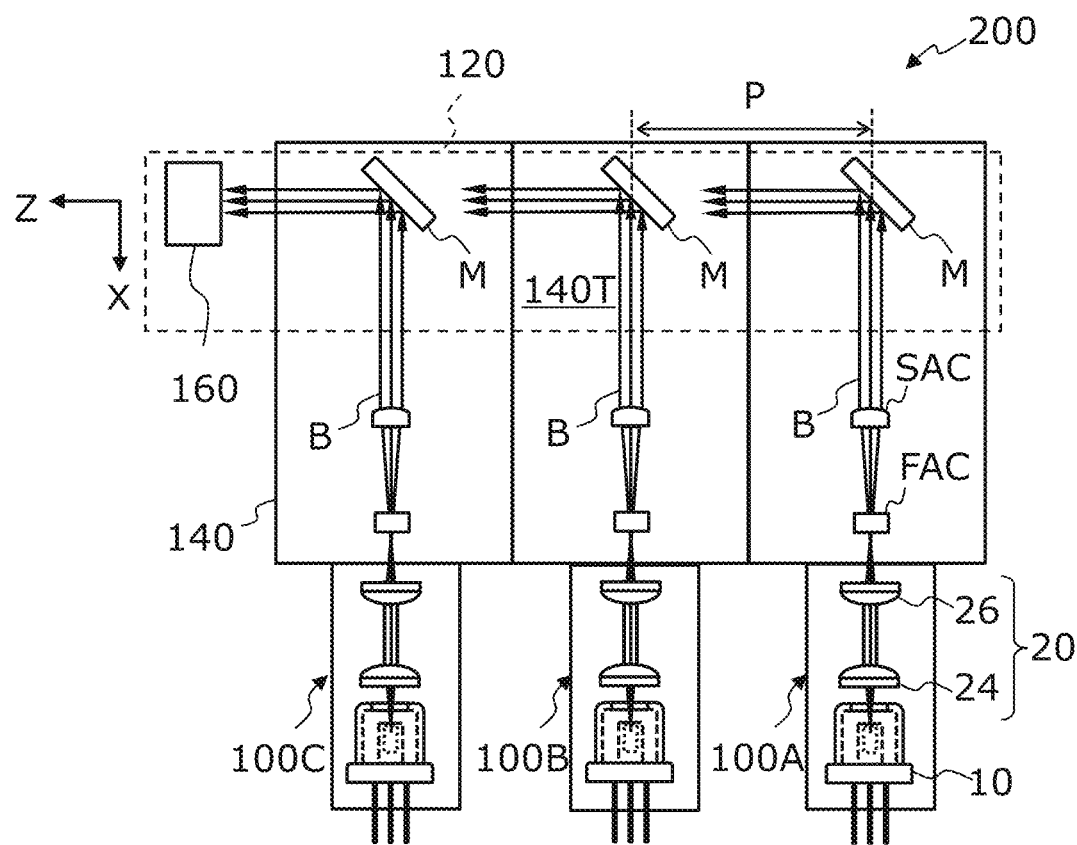
FIG. 7A is a schematic top view of a laser light source module 200 according to one embodiment, when viewed from the normal direction of the XZ plane.
Figure 7B:
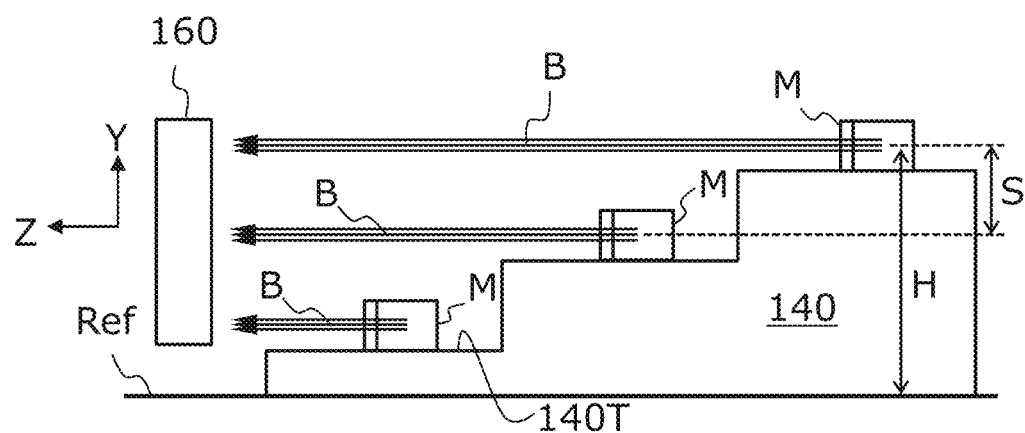
FIG. 7B is a schematic side view of the laser light source module 200 according to one embodiment, when viewed from the normal direction of the YZ plane.
Figure 7C:
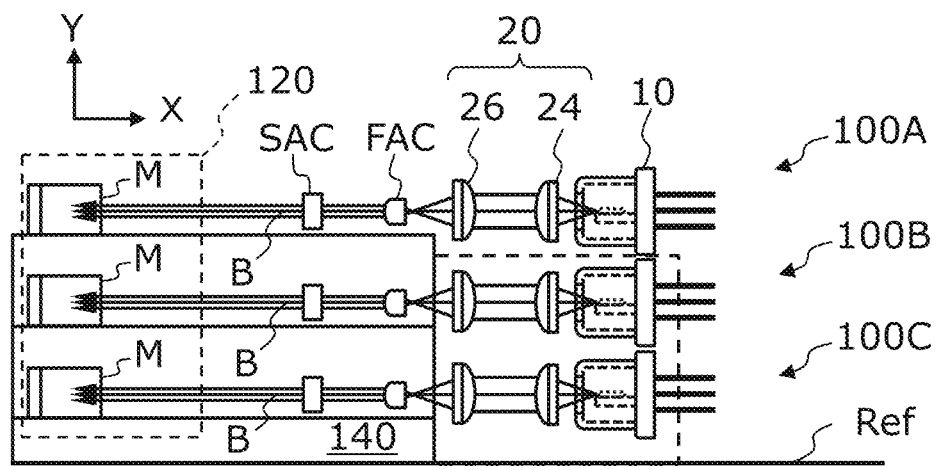
FIG. 7C is a schematic front view of the laser light source module 200 according to one embodiment, when viewed from the normal direction of the XY plane.

Next, with reference to FIG. 7A, FIG. 7B, and FIG. 7C, an embodiment of a laser light source module according to the present disclosure will be described. FIG. 7A is a schematic top view of a laser light source module 200 according to the present embodiment when viewed from the normal direction of the XZ plane; FIG. 7B is a schematic side view when viewed from the normal direction of the YZ plane; and FIG. 7C is a schematic front view when viewed from the normal direction of the XY plane. The structure shown in FIGS. 7A to 7C is accommodated in a housing not shown in drawings.

Figure 8:
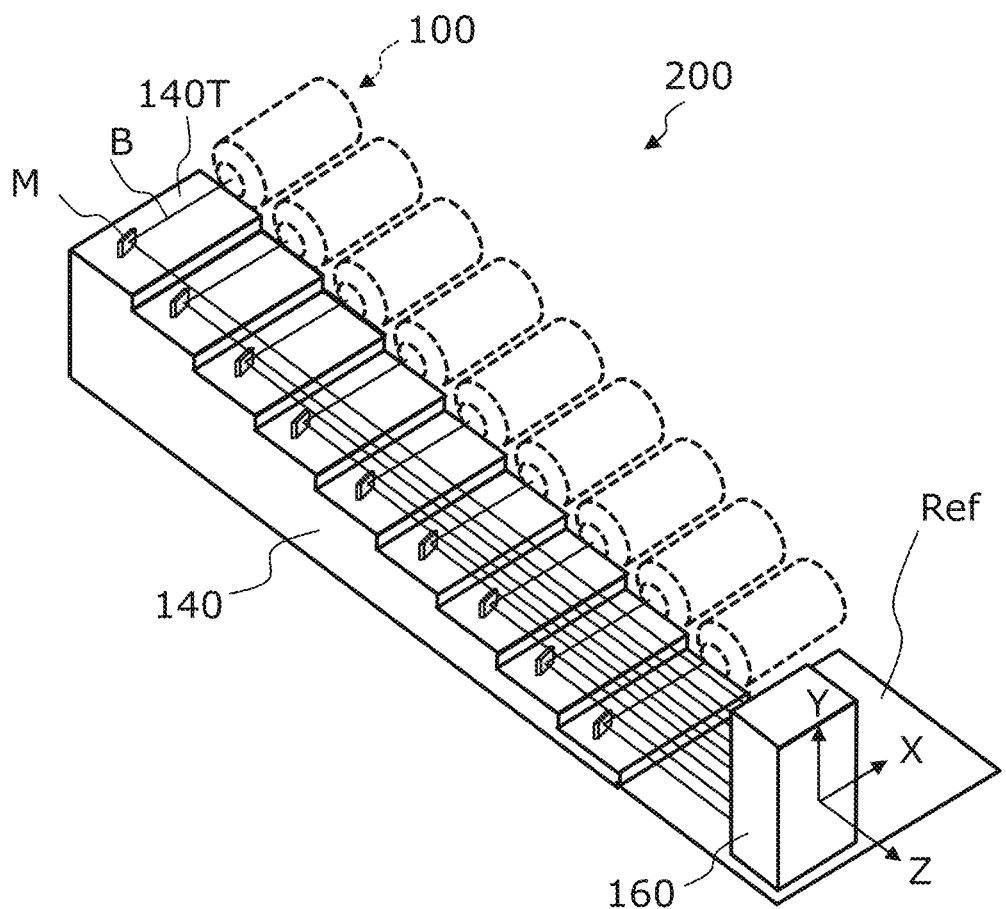
FIG. 8 is a perspective view schematically showing another example structure including nine light source units 100.

The laser light source module 200 shown in FIGS. 7A to 7C includes a plurality of laser light sources 100A, 100B and 100C, and a beam combiner 120. Each of the plurality of laser light sources 100A, 100B and 100C is the light source unit 100 described above. Hereinafter, for simplicity, the laser light sources 100A, 100B and 100C may be collectively referred to as the "light source unit 100." Any appropriate number of light source units 100 may be included in a single laser light source module 200. Although the laser light source module 200 in this example includes three light source units 100, generally four or more light source units 100 may be employed. FIG. 8 is a perspective view schematically showing another example structure including nine light source units 100. The light output and light intensity of the combined beam can be increased in proportion to the number of light source units 100. In order to fill a limited space with a large number of collimated beams so as to increase a packing fraction, it is preferable to reduce the fast-axis size of each collimated beam to reduce the pitch S between the centers of the collimated beams B along the Y axis (the fast axis) direction.

Although each collimated beam B is schematically illustrated in the figures as being perfectly parallel light, the actual collimated beam B would, after reaching a smallest beam radius at the beam waist, diverge with a predetermined divergence angle. Therefore, in the example shown in FIG. 8, if an excessively great number of light source units 100 are employed, the collimated beam B emitted from a light source unit 100 at a distant position from a convergent optical system 160 may have a long optical path, resulting in a greatly diverged beam diameter. In one example, when the fast-axis collimator lens FAC has an effective focal length of 0.3 mm, the distance from the fast-axis collimator lens FAC to the beam waist of the collimated beam B is e.g. about 50 mm. In such an example, if employing more than ten light source units 100, the maximum optical path length will be much greater than 50 mm. Accordingly, divergence of the collimated beam B may not be negligible, which may hinder proper focusing onto an optical fiber that has a small core size. Therefore, it is not preferable that an excessively great number of collimated beams B be combined by spatial beam combining; rather, it is desirable to set an appropriate range for the number of collimated beams B to be combined by spatial beam combining according to the conditions.

The beam combiner 120 is configured to spatially combine a plurality of collimated beams B that are emitted from the plurality of light source units 100. In the present embodiment, the collimated beam B that is emitted from each light source unit 100 has essentially the same wavelength (e.g., about 465 nm±10 nm), but the respective collimated beams B are not mutually synchronized in phase. Therefore, the plurality of collimated beams B are combined incoherently.

In the present embodiment, the laser light source module 200 includes a support base (i.e., support) 140 that supports the plurality of light source units 100 such that the distances (heights) H from a reference plane Ref to the centers of respective collimated beams B are different. As shown in FIG. 7B, the support 140 has a supporting surface 140T that includes a plurality of steps. The pitch S between the centers of the collimated beams B along the Y axis (the fast axis) direction corresponds to the size of each step on the supporting surface 140T of the support 140. The pitch S between the centers of the collimated beams B along the Y axis may be set in the range of, for example, 200 μm to 350 μm, and the steps are illustrated in exaggerated size in FIG. 7B, FIG. 7C, and FIG. 8 for ease of understanding. As shown in FIG. 7A, the light source units 100 are arranged along the Z axis direction with a pitch P between the centers of the collimated beams B along the Z axis direction.

The beam combiner 120 in the present embodiment includes a mirror array, which includes a plurality of mirrors M respectively reflecting the plurality of collimated beams B. More specifically, the supporting surfaces 140T of the support 140 support respective mirrors M, the number of which corresponds to the number of light source units 100, at respectively different heights (level positions). The position and orientation of each mirror M are aligned so as to reflect the corresponding collimated beam B toward the convergent optical system 160. In a certain example, each mirror M rotates the collimated beam B by 90 degrees around an axis that is parallel to the Y axis. Thus, the array of mirrors M in the present embodiment allows the plurality of collimated beams B, having been reflected, to be propagated along a plane (the YZ plane) that is perpendicular to the reference plane Ref. The mirrors M may be fixed on a housing wall (not shown in drawings), or fixed via certain parts that allow the position and orientation of each mirror M to be adjusted. It is desirable that the reflection surface of each mirror M is constituted by a multilayer film having a selectively high reflectance for the wavelength of the collimated beam B that is incident thereon.

The pitch S between the centers of the collimated beams B along the Y axis direction is greater than the size of each mirror M along the Y axis direction. The size of each mirror M along the Y axis direction is, in a certain example, set to equal to or greater than twice the Y-axis radius $\omega_{y2}$ of each collimated beam B. Herein, strictly speaking, $\omega_{y2}$ is the value at the beam waist of the collimated beam B; however, because the divergence half angle is sufficiently small, the Y-axis radius of the collimated beam B on the optical path in this example may be regarded as essentially equal to $\omega_{y2}$ by approximation. In the present embodiment, $S > 2 \times \omega_{y2}$ holds true. When $\omega_{y2}$ is e.g. 100 μm, S may be set to e.g. 300 μm ($=2.5 \times \omega_{y2}$). The smaller the Y-axis radius $\omega_{y2}$ of each collimated beam B, the smaller the pitch S between the centers of the collimated beams B along the Y axis direction can be. If the light source units 100Q as shown in FIG. 3B are employed instead of the light source units 100 according to the present embodiment, the Y-axis radius $\omega_{y2}$ of each collimated beam B is about 1 mm. Accordingly, the size S of the steps is required to be about 1 mm or more, so that the beam diameter after spatial beam combining becomes excessively large. Moreover, the greater the number of light source units 100 being employed, for example, as illustrated in FIG. 8, the more conspicuous this problem becomes. However, using the light source units 100 according to the present embodiment allows for solving this problem.

When determining the pitch S between the centers of the collimated beams B along the Y axis direction, physical interference between light source units 100 need not be considered. On the other hand, the pitch P between the centers of the collimated beams B along the Z axis direction is determined so that no two adjacent light source units 100 will physically interfere.

The beam combiner 120 includes the optical system 160, which converges the plurality of collimated beams B reflected by respective ones of the plurality of mirrors M. The optical system 160 in the present embodiment optically couples the plurality of collimated beams B to an optical fiber not shown. The reflection surface of each mirror M does not need to be flat. The mirrors M may perform at least a part of the converging function of the optical system 160. Moreover, the beam combiner 120 may include optical parts other than the mirrors M, e.g., a filter(s) having wavelength selectivity.

The structure shown in FIG. 7A, FIG. 7B, FIG. 7C, and FIG. 8 may be accommodated in a housing, which is not shown in drawings. While the housing may be referred to as a package, as compared to the semiconductor laser package described above, a greater number of components are accommodated inside the housing, which makes it difficult to achieve a sufficient cleanliness for reducing the optical dust-attracting effect and maintain airtightness.

Figure 9A:
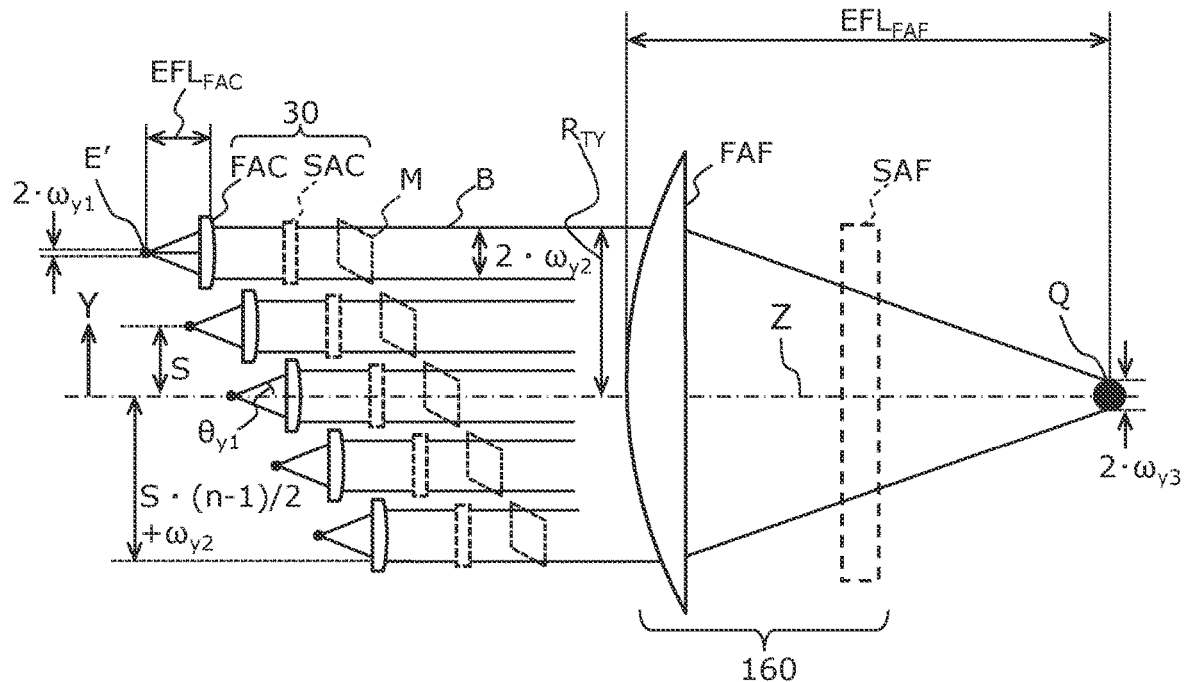
FIG. 9A is a diagram showing an example structure of an optical system 160.
Figure 9B:
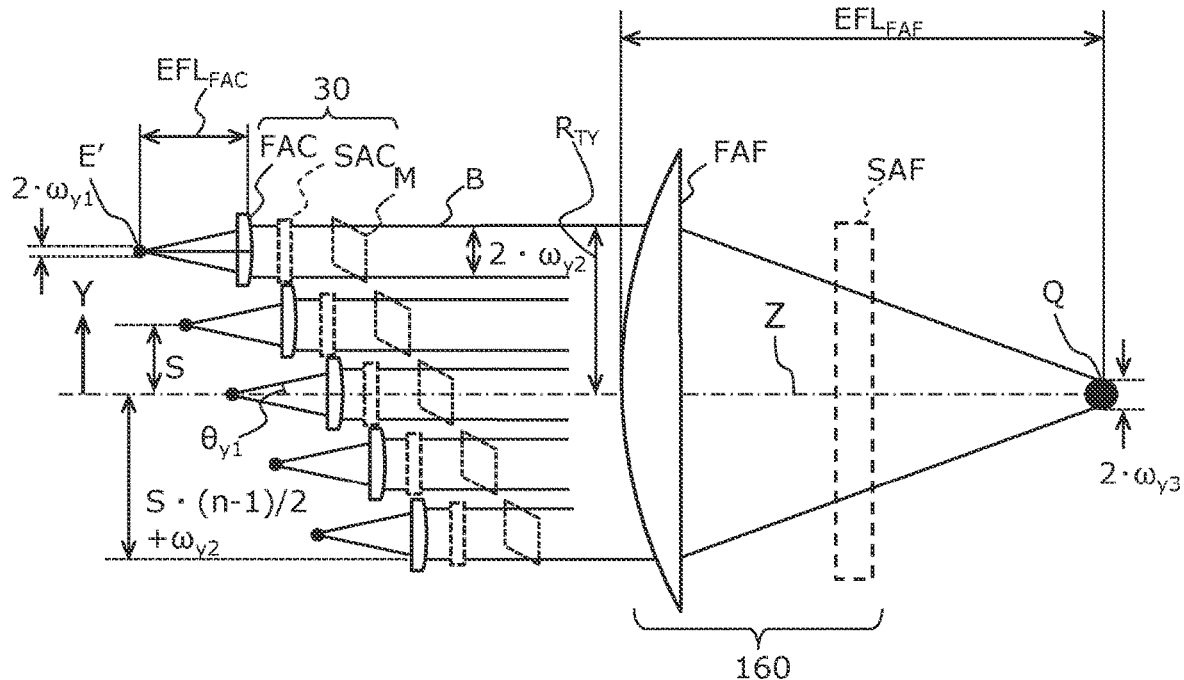
FIG. 9B is a diagram showing another example structure of the optical system 160.

Hereinafter, with reference to FIG. 9A and FIG. 9B, an example structure of an optical system 160 for combining the plurality of collimated beams B will be described. FIG. 9A and FIG. 9B each show an example structure for the optical system 160 to converge n collimated beams B, which are distanced by a pitch S between the centers along the fast axis (the Y axis) direction. The difference between the example of FIG. 9A and the example FIG. 9B is a difference in the fast-axis collimator lens FAC.

While n in the examples shown in FIG. 9A and FIG. 9B is an odd number that is 3 or more, n may be an even number. For simplicity, while each collimated beam B is illustrated as perfectly parallel rays in the figures, as has been described above, an actual collimated beam B reaches the smallest beam radius at its beam waist, and thereafter diverges with a predetermined divergence angle. Given that the n collimated beams B that are incident on the optical system 160 have an overall size of $2 \times R_{TY}$ along the Y axis direction, then the relationship $2 \times R_{TY} = S \times (n-1) + 2 \times \omega_{y2}$ is satisfied. This relationship can be rewritten to $R_{TY} = S \times (n-1)/2 + \omega_{y2}$. The n collimated beams B are in a linear array along the fast axis (the Y axis) direction, and accordingly the overall size of the n collimated beams B along the X axis direction is equal to the size $2 \times \omega_{x2}$ of each individual collimated beam B along the X axis direction.

The optical system 160 in each of FIG. 9A and FIG. 9B includes a slow-axis converging lens SAF and a fast-axis converging lens FAF, which are located in this order from the position (back focal point) Q of its convergence point, the slow-axis converging lens SAF being closer to the back focal point Q. These lenses are cylindrical lenses. It is assumed that the Z axis (dot-dash line) coincides with the optical axis of the optical system 160. The fast-axis converging lens FAF converges all collimated beams B within a plane (the YZ plane) that contains the Z axis and the fast-axis direction (the Y axis). The slow-axis converging lens SAF converges each collimated beam B within a plane that contains the Z axis and the slow-axis (X axis) direction (i.e., the XZ plane, which is perpendicular to the plane of the figure).

The fast-axis converging lens FAF and the slow-axis converging lens SAF are disposed so that respective back focal points of the fast-axis converging lens FAF and the slow-axis converging lens SAF coincide with each other. The Y-axis radius $\omega_{y3}$ of the combined laser beam at a converged position Q has a value resulting from multiplying the Y-axis radius $\omega_{y1}$ of the imaginary light source with a magnification ($EFL_{FAF}/EFL_{FAC}$). As used herein, $EFL_{FAC}$ represents an effective focal length of the fast-axis collimator lens FAC, whereas $EFL_{FAF}$ represents an effective focal length of the fast-axis converging lens FAF.

As described above, in certain embodiments of the present disclosure, when the effective focal length F2 of the imaging lens structure 26 is longer than the effective focal length F1 of the objective lens structure 24, the lateral magnification of the image that is created on the image plane 22 is F2/F1, so that the size of the image E' of the emitter region E at the image plane 22 is enlarged to F2/F1 times that of the actual emitter region E. Moreover, the greater the value of F2/F1, the smaller the fast-axis direction divergence half angle (divergence half angle in a far field) $\theta_{y1}$ of the beam that is emitted from the imaginary light source. When the fast-axis direction divergence half angle (divergence half angle in a far field) $\theta_{y1}$ of the beam that is emitted from the imaginary light source is reduced, the numerical aperture of the fast-axis collimator lens FAC can be decreased and the effective focal length can be increased. In the example structure of FIG. 9B, $\theta_{y1}$ is smaller than in the example structure of FIG. 9A. Employing a fast-axis collimator lens FAC with a longer effective focal length $EFL_{FAC}$ allows for reducing the lateral magnification ($EFL_{FAF}/EFL_{FAC}$) by the fast-axis collimator lens FAC and the fast-axis converging lens FAF at the converged position Q. Thus, when the lateral magnification at the converged position Q decreases, tolerance of misalignment of the convergent beam spot with respect to the core of an optical fiber can be increased.

In one example, when $\omega_{y1}$=2.0 μm, $EFL_{FAC}$=0.3 mm, and $EFL_{FAF}$=10.0 mm, then $\omega_{y3}$=66.7 μm. Alternatively, when $\omega_{y1}$=4.0 μm, $EFL_{FAC}$=0.6 mm, and $EFL_{FAF}$=10.0 mm, then $\omega_{y3}$=66.7 μm. Given an effective focal length $EFL_{SAC}$ of the slow-axis collimator lens SAC and an effective focal length $EFL_{SAF}$ of the slow-axis converging lens SAF, then the X-axis radius $\omega_{x3}$ of the combined laser beam at the converged position Q has a value resulting from multiplying the X-axis radius $\omega_{x1}$ of the imaginary light source with a magnification ($EFL_{SAF}/EFL_{SAC}$). For example, when $\omega_{x1}$=80 μm, $EFL_{SAC}$=5.0 mm, and $EFL_{SAF}$=4.0 mm, then $\omega_{x3}$=64 μm.

According to the present embodiment, laser beams can be focused onto a multi-mode optical fiber having a numerical aperture of about 0.2 and a core diameter of 100 μm, for example. When n laser beams are combined incoherently, the light intensity is increased n times. In the structure of FIG. 3B, the convergent optical system 160 needs to increase in size due to the increase of S and $R_{TY}$.

Figure 10A:
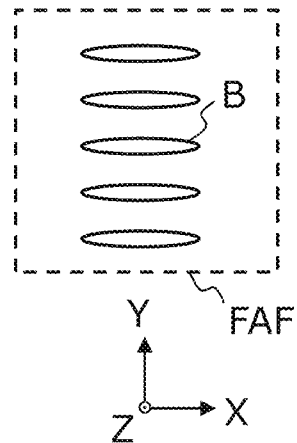
FIG. 10A is a diagram schematically showing a beam cross-sectional shape in the case in which five collimated beams B are incident on a fast-axis converging lens FAF.
Figure 10B:
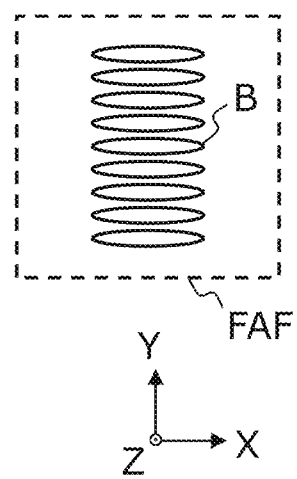
FIG. 10B is a diagram schematically showing a beam cross-sectional shape in the case in which nine collimated beams B are incident on a fast-axis converging lens FAF.
Figure 10C:
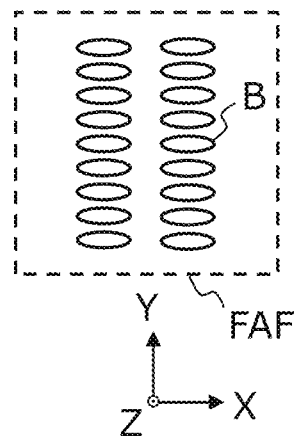
FIG. 10C is a diagram schematically showing a beam cross-sectional shape in the case in which nine×2 rows of collimated beams B are incident on a fast-axis converging lens FAF.
Figure 11:
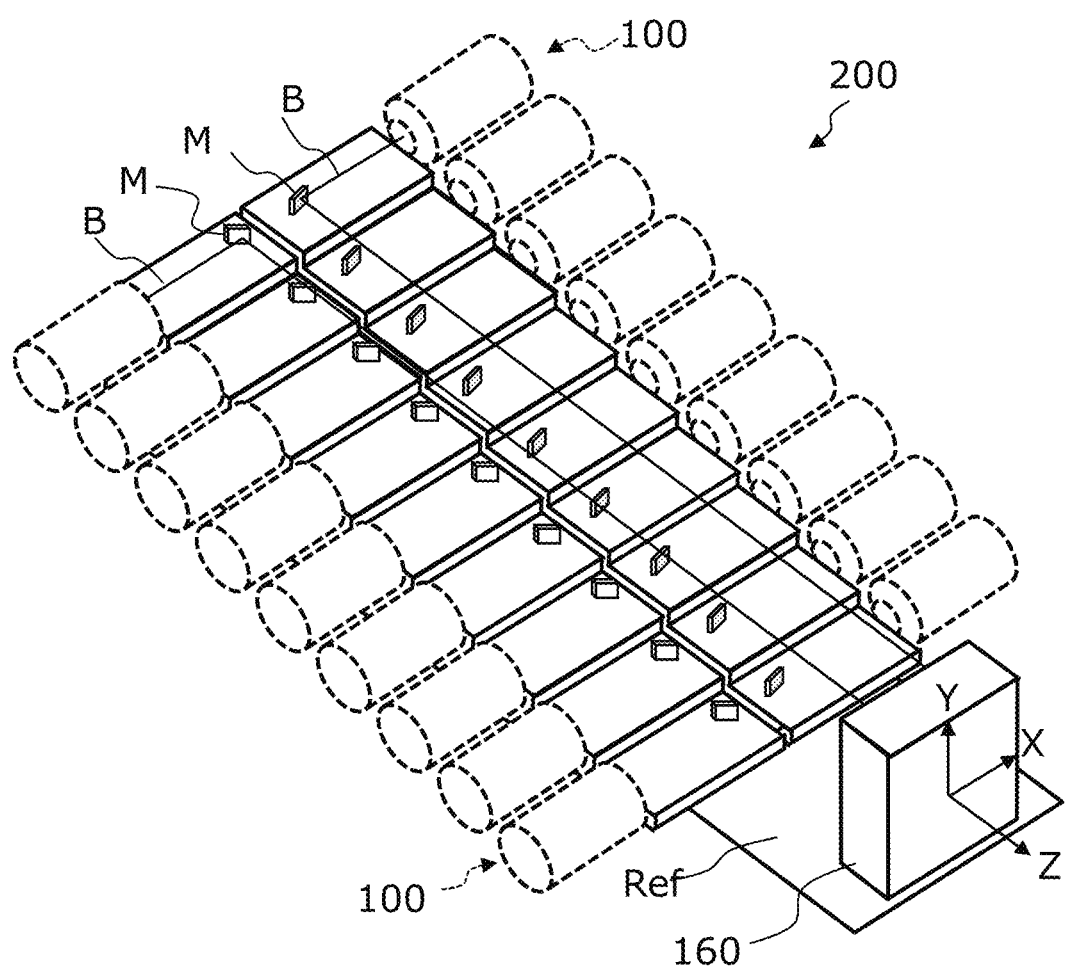
FIG. 11 is a perspective view showing another example structure of the laser light source module 200.

FIG. 10A, FIG. 10B, and FIG. 10C schematically show beam cross-sectional shapes in the respective cases where five, nine, and nine×2 rows of collimated beams B are incident on the fast-axis converging lens FAF. The implementation of FIG. 10C is obtained by, as shown in FIG. 11, arraying a plurality of light source units 100 in two rows.

Figure 12:
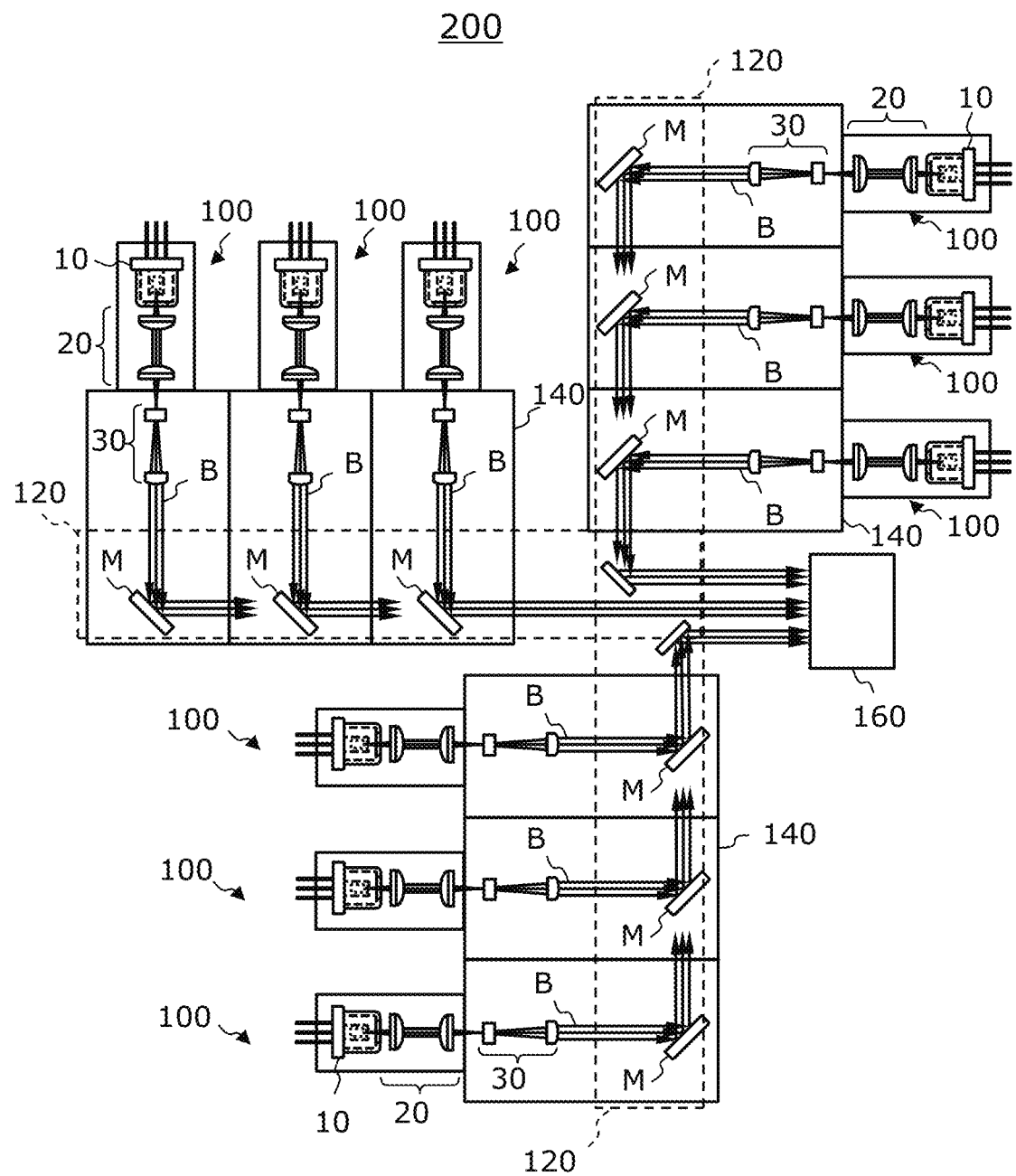
FIG. 12 is a diagram showing another example structure of the laser light source module 200.

Any appropriate configurations other than that described above may be employed for the arrangement of the light source units 100. FIG. 12 is a schematic top view showing still another example of the arrangement of the light source units 100. The plurality of light source units 100 may be arranged such that beams emitted from the plurality of light source units 100 are in three rows adjacent to one another. Moreover, the plurality of light source units 100 and/or mirrors M do not need to be parallel to one another, but may be inclined.

According to an embodiment of the present disclosure, the LD 12 is accommodated in a package, and accordingly a decrease in light output of the LD 12 associated with the optical dust-attracting effect etc., that may be caused by a high-power and short-wavelength laser beam can be reduced, so that reliability can be improved. Moreover, a plurality of collimated beams B can be combined with a high spatial density, so that the light output can be effectively enhanced. Furthermore, an increase in the fast-axis size of each collimated beam B is reduced, which can increase freedom for the spatial arrangement of the light source units 100, so that a large number of collimated beams B can be densely arranged. This allows a high-power laser beam to couple to an optical fiber with a high efficiency.

While a single LD 12 is accommodated in each package 10 in the embodiments described above, each package 10 may accommodate a plurality of LDs 12. Further, while each LD 12 has one emitter region E in the embodiments described above, a single LD 12 may have a plurality of emitter regions E. Thus, even when a plurality of emitter regions E (emitter array) are located inside a single package 10, the effects in embodiments of the present disclosure can be obtained. In other words, creating an imaginary light source in free space by transferring an image of the emitter array located inside each package 10 onto the image plane 22 of the first lens structure 20 allows for designing the second lens structure 30 without being constrained by the package structure.

Direct Diode Laser Device

Figure 13:
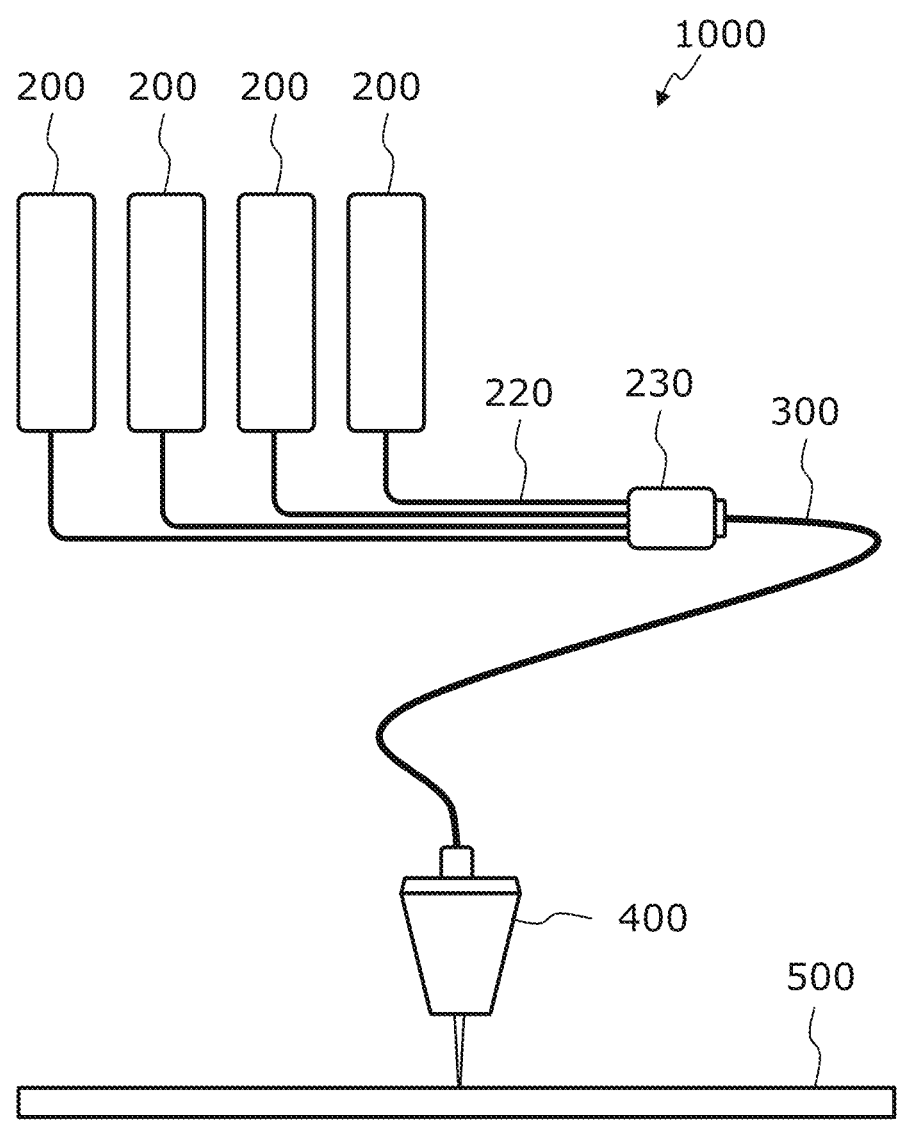
FIG. 13 is a diagram showing an example structure of an embodiment of a direct diode laser (DDL) device according to the present disclosure.

Next, with reference to FIG. 13, one embodiment of a direct diode laser (DDL) device according to the present disclosure will be described. FIG. 13 is a diagram showing an example structure of a DDL device 1000 according to the present embodiment.

The illustrated DDL device 1000 includes four laser light source modules 200, a processing head 400, and an optical transmission fiber 300 that connects the laser light source modules 200 to the processing head 400. The number of laser light source modules 200 is not limited to four; there may be one or more laser light source modules 200.

Each laser light source module 200 has a similar construction to the above-described construction. The number of LDs mounted in each laser light source module 200 is not particularly limited, and may be determined in accordance with the light output or irradiance that is needed. The wavelength of the laser light to be radiated from each LD may also be selected in accordance with the material to be processed. For example, in the case in which copper, brass, aluminum or the like is to be processed, LDs whose central wavelength is in the range from 350 nm to 550 nm may be suitably employed. The wavelength of laser light that is radiated from each LD does not need to be the same; laser light of different central wavelengths may be superposed. The effects according to embodiments of the present invention can also be obtained in the case of using laser light whose central wavelength is outside the range from 350 nm to 550 nm.

In the illustrated example, an optical fiber 220 extending from each of the plurality of laser light source modules 200 is coupled to the optical transmission fiber 300 via an optical fiber coupler 230. The processing head 400 allows a laser beam emitted from the leading end of the optical transmission fiber 300 to be converged onto the target object 500 via an optical system not shown, thus irradiating the target object 500. In the case where a single DDL device 1000 includes M laser light source modules 200 and N LDs are mounted in each laser light source module 200, when a single LD has a light output of P watts, then a laser beam having a light output of P×N×M watts at the most can be converged onto the target object 500. Herein, N is an integer that is 2 or more; M is a positive integer. For example, when P=10 watts, N=9, and M=12, then a light output over 1 kilowatt can be achieved.

According to the present embodiment, because each LD in the laser light source module is accommodated in a semiconductor laser package, a decrease in light output caused by the optical dust-attracting effect or the like is reduced, so that reliability can be improved. Moreover, a limited space can be filled with a large number of collimated beams having a small beam diameter, and accordingly a high light output can be attained with a small-sized device, and coupling to an optical fiber is easy.

Fiber Laser Device

Figure 14:
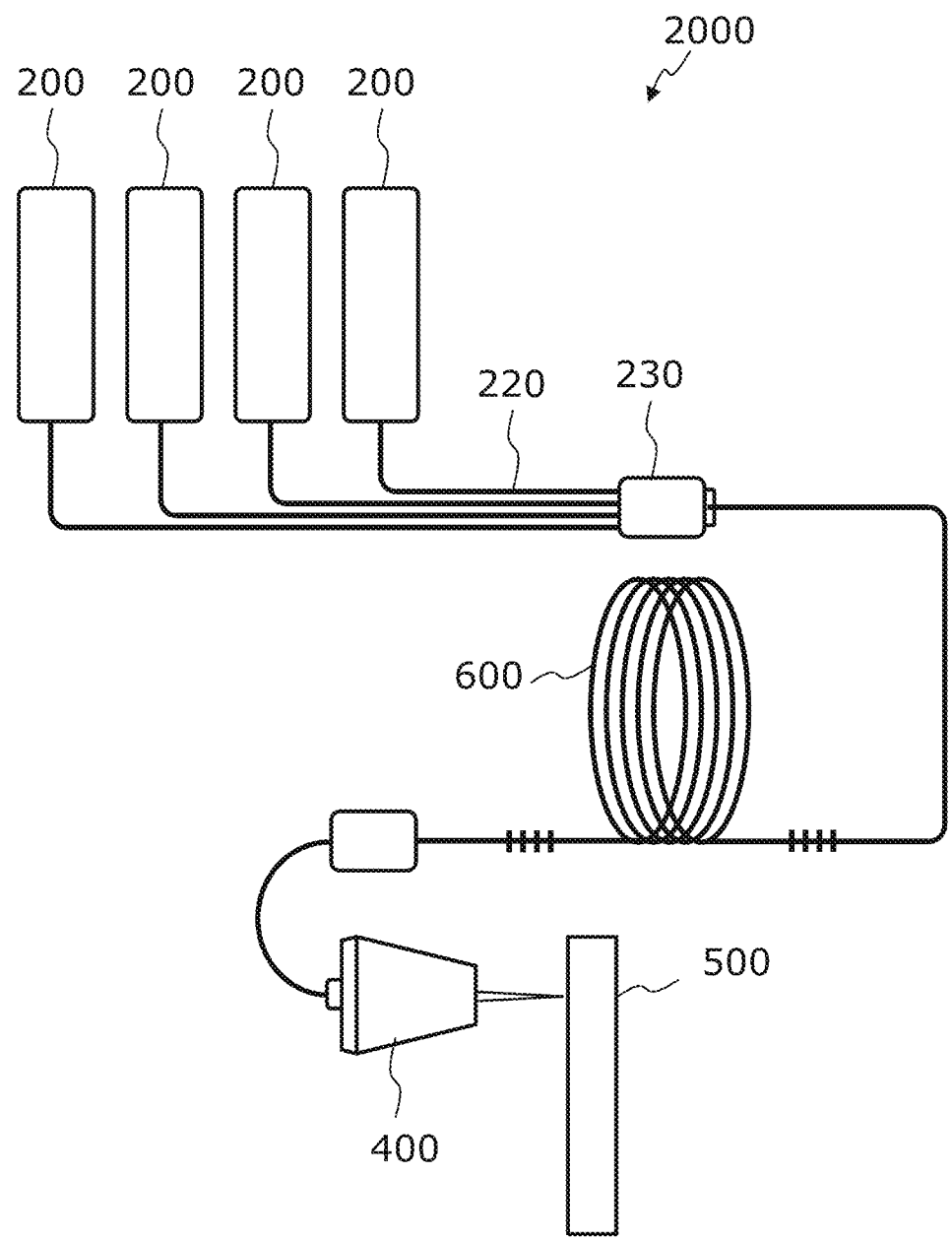
FIG. 14 is a diagram showing an example structure of an embodiment of a fiber laser device according to the present disclosure.

Next, with reference to FIG. 14, one embodiment of a fiber laser device according to the present disclosure will be described. FIG. 14 is a diagram showing an example structure of a fiber laser device 2000 according to the present embodiment.

The fiber laser device 2000 shown in FIG. 14 includes laser light source modules 200 functioning as pumping light sources and a rare earth-added optical fiber 600 that is optically excited by pumping light that is emitted from the laser light source modules 200. In the example shown in FIG. 14, an optical fiber 220 extending from each of the plurality of laser light source modules 200 is coupled to the rare earth-added optical fiber 600 via an optical fiber coupler 230. The rare earth-added optical fiber 600 is located between a pair of fiber Bragg gratings that define a resonator. In the case where the rare earth-added optical fiber 600 is doped with Yb ions, laser light source modules 200 configured to generate pumping light having a wavelength of e.g. 915 nm are used. In each laser light source module 200 according to certain embodiments of the present disclosure, the LD is accommodated in a semiconductor laser package, so that, as described above, great effects can be obtained particularly when employing an LD that emits blue or green laser light. Moreover, in the case of using a rare earth-added optical fiber 600 being made of fluoride glass that is doped with praseodymium (Pr), for example, visible-light laser oscillation with blue pumping light can be realized. The laser light source modules 200 according to an embodiment of the present disclosure is useful as such a pumping light source.

The processing head 400 converges a laser beam emitted from the leading end of the rare earth-added optical fiber 600 onto a target object 500 via an optical system not shown, thus irradiating the target object 500.

Thus, in certain embodiments, a laser light source module according to the present disclosure includes a plurality of laser light sources each being the light source unit described above, and a beam combiner that spatially combines a plurality of collimated beams that are respectively emitted from the plurality of laser light sources.

In certain embodiments, a support is included that supports the plurality of laser light sources such that the heights from a reference plane to the centers of the plurality of collimated beams are respectively different. The beam combiner includes: a mirror array having a plurality of mirrors each of which reflect a respective one of the plurality of collimated beams, such that the plurality of collimated beams having been reflected are propagated along a plane that is perpendicular to the reference plane; and an optical system that converges the plurality of collimated beams having been reflected by the plurality of mirrors.

Moreover, in certain embodiments, a direct diode laser device according to the present disclosure includes at least one laser light source module as described above; an optical fiber configured to propagate a laser beam emitted from the laser light source module and to emit the laser beam; and a processing head coupled to the optical fiber and configured to irradiate a target object with the laser beam emitted from the optical fiber.

Furthermore, in certain embodiments, a fiber laser device according to the present disclosure includes: at least one laser light source module as described above; and a rare earth-added optical fiber configured to be pumped by the laser beam emitted from the laser light source module.

Example of Modifications of Light Source Unit

Figure 15:
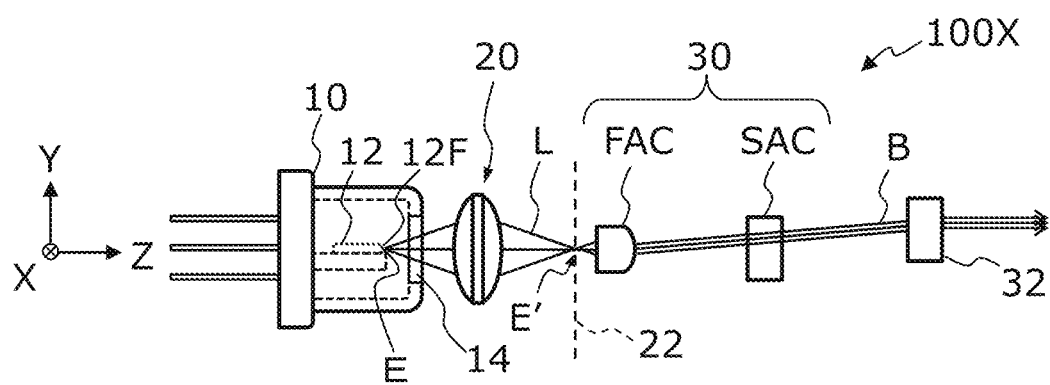
FIG. 15 is a diagram showing an example of modification of a light source unit according to certain embodiments of the present disclosure.

FIG. 15 is a diagram showing an example of modification of a light source unit according to an embodiment of the present disclosure. In the illustrated example, a light source unit 100X includes a sealed package 10, a first lens structure 20, a second lens structure 30, and an optical path correction element 32. Structures of the package 10, the first lens structure 20, and the second lens structure 30 are similar to those in examples shown in embodiments described above. The light source unit 100X of this modification differs from the light source unit 100 described above in that the light source unit 100X includes the optical path correction element 32. The optical path correction element 32 is an element configured to change the propagation direction of a collimated beam B emitted from the second lens structure 30.

Figure 16:
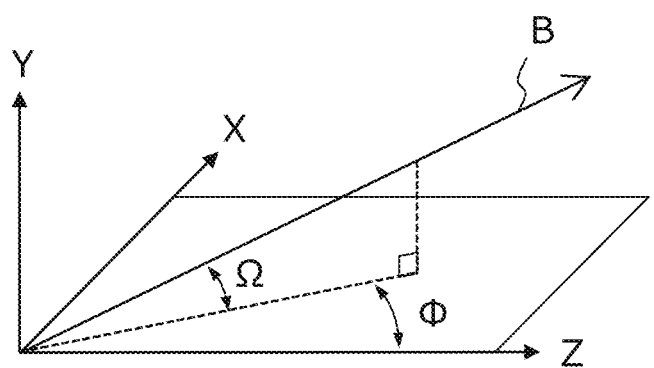
FIG. 16 is a schematic perspective view schematically showing an example where the propagation direction of a collimated beam B is inclined with respect to the Z axis.

FIG. 16 is a perspective view schematically showing an example in which the optical path correction element 32 is absent and the propagation direction of the collimated beam B is inclined with respect to the Z axis. The collimated beam B is rotated within the XZ plane by an azimuth angle $\Phi$ from the positive direction on the Z axis toward the positive direction on the X axis, and also is rotated from the XZ plane by an angle of elevation $\Omega$ in the positive direction on the Y axis. Rotation at the azimuth angle $\Phi$ and rotation at the angle of elevation $\Omega$ may be caused mainly due to misalignments on the fast-axis collimator lens FAC and the slow-axis collimator lens SAC, respectively. For example, even deviation of the position of the fast-axis collimator lens FAC along the Y axis direction by 1 μm from a predetermined position may cause rotation at an angle of elevation $\Omega$ of 0.1 degrees may arise. Even when $\Omega$=0.1 degrees, as the optical path becomes longer, the positional deviation of the collimated beam B may be excessive. For example, in the laser light source modules 200 described with reference to FIG. 8, an deviation in angle of about 0.1 to about 1.0 degrees that has occurred in the collimated beam B may have an adverse effect on the focusing by the convergent optical system 160. Even if the position of the fast-axis collimator lens FAC along the Y axis direction is at the predetermined position, if the position of the slow-axis collimator lens SAC along the X axis direction is deviated from a predetermined position, then rotation at an azimuth angle $\Phi$ that is not 0 degrees may be caused.

Using the optical path correction element 32 in FIG. 15, the orientation of the collimated beam B can be corrected, so that the angle of elevation $\Omega$ and the azimuth angle $\Phi$ can be close to 0 degrees. The optical path correction element 32 includes an optical member that refracts the collimated beam B, and examples of such an optical member include a wedge prism. Hereinafter, an example structure and operation of an optical path correction element 32 having a circular-shaped wedge prism, this being one example, will be described.

Figure 17A:
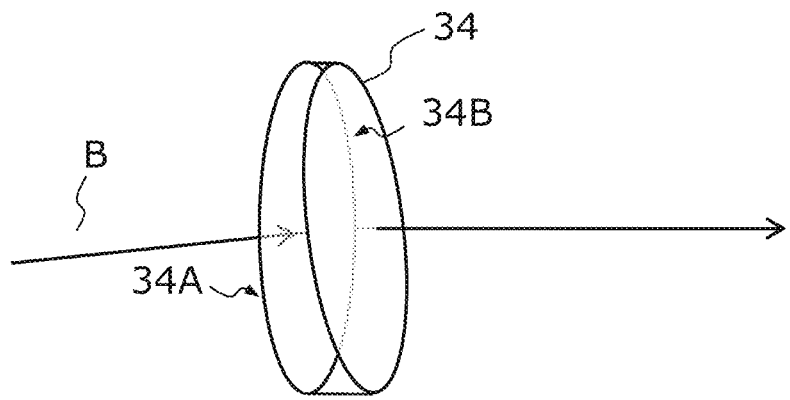
FIG. 17A is a perspective view schematically showing a wedge prism 34.
Figure 17B:
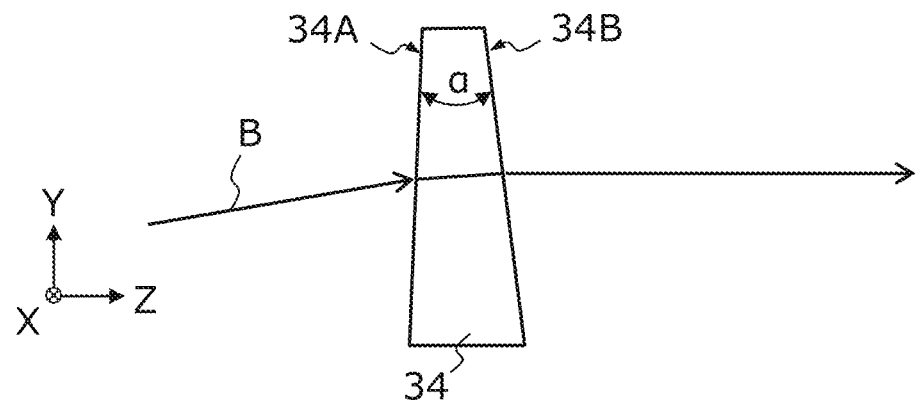
FIG. 17B is a cross-sectional view schematically showing the wedge prism 34.
Figure 17C:
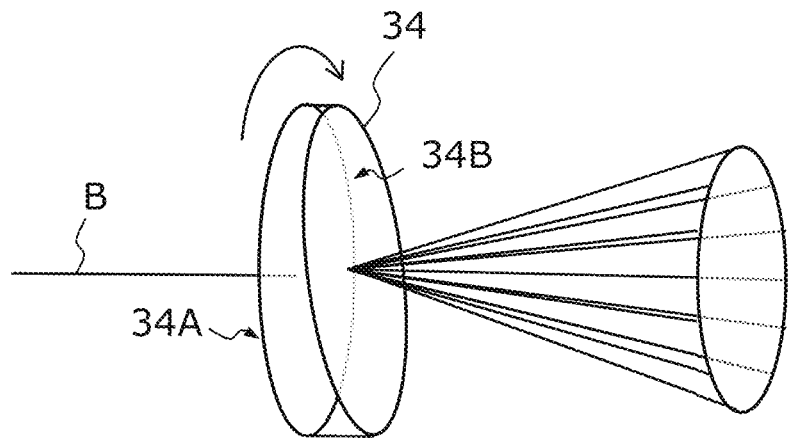
FIG. 17C is a diagram schematically showing steering of a collimated beam B emitted from the wedge prism 34 through a path tracing an imaginary circular conical surface.

FIGS. 17A and 17B are a perspective view and a cross-sectional view schematically showing a wedge prism 34. FIG. 17C schematically shows rotation of the wedge prism 34 in the direction of an arrow, such that a collimated beam B emitted from the wedge prism 34 is steered through a path tracing an imaginary circular conical surface.

The wedge prism 34 is a prism with an angle α that is not 0 degrees defined by a light-entering surface 34A and a light-emission surface 34B thereof. The angle α is in the range of 0.1 degrees to 1.0 degrees, for example. The wedge prism 34 may be made of optical glass having a refractive index of about 1.5, for example. A collimated beam B incident on the light-entering surface 34A of the wedge prism 34 is refracted at an interface between the air (refractive index: about 1.0) and the light-entering surface 34A, and at an interface between the light-emission surface 34B and the air. Through the two refractions, the propagation direction (beam axis direction) of the collimated beam B can be changed by a predetermined angle. Therefore, by using the wedge prism 34 to change the propagation direction of the collimated beam B into an appropriate direction and at an appropriate angle, the angle of elevation Ω and the azimuth angle Φ described above can be close to zero degrees.

Figure 18:
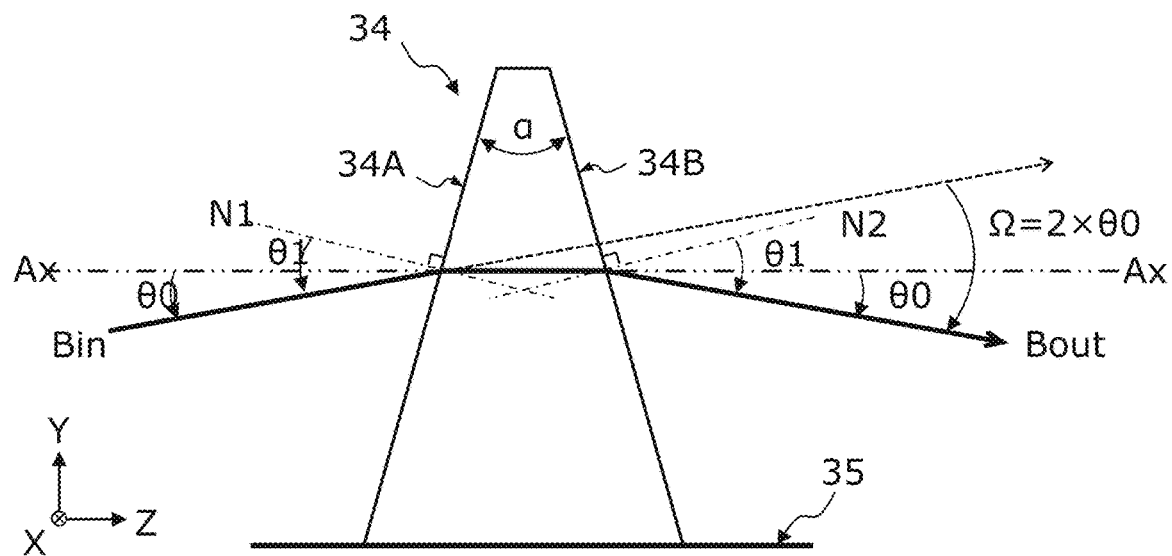
FIG. 18 is a diagram showing a wedge prism 34 having a prism shape whose cross section is symmetric.

Next, with reference to FIG. 18, refraction of a ray by the wedge prism 34 will be described. FIG. 18 shows a wedge prism 34 having a prism shape with a symmetric cross section. In FIG. 18, the wedge prism 34 placed on a horizontal plane 35 is illustrated. An incident ray Bin is incident on a light-entering surface 34A by an angle θ0 with respect to the axis Ax of the wedge prism 34. The incident angle of the incident ray Bin is defined by its angle θ1 with respect to the normal N1 of the light-entering surface 34A. Due to symmetry of the wedge prism 34, the emitted ray Bout emitted from the light-emission surface 34B at the angle θ0 with respect to the axis Ax of the wedge prism 34. An emission angle of the emitted ray Bout is determined by an angle θ1 of the emitted ray Bout with respect to the normal N2 of the light-emission surface 34B.

Figure 19:
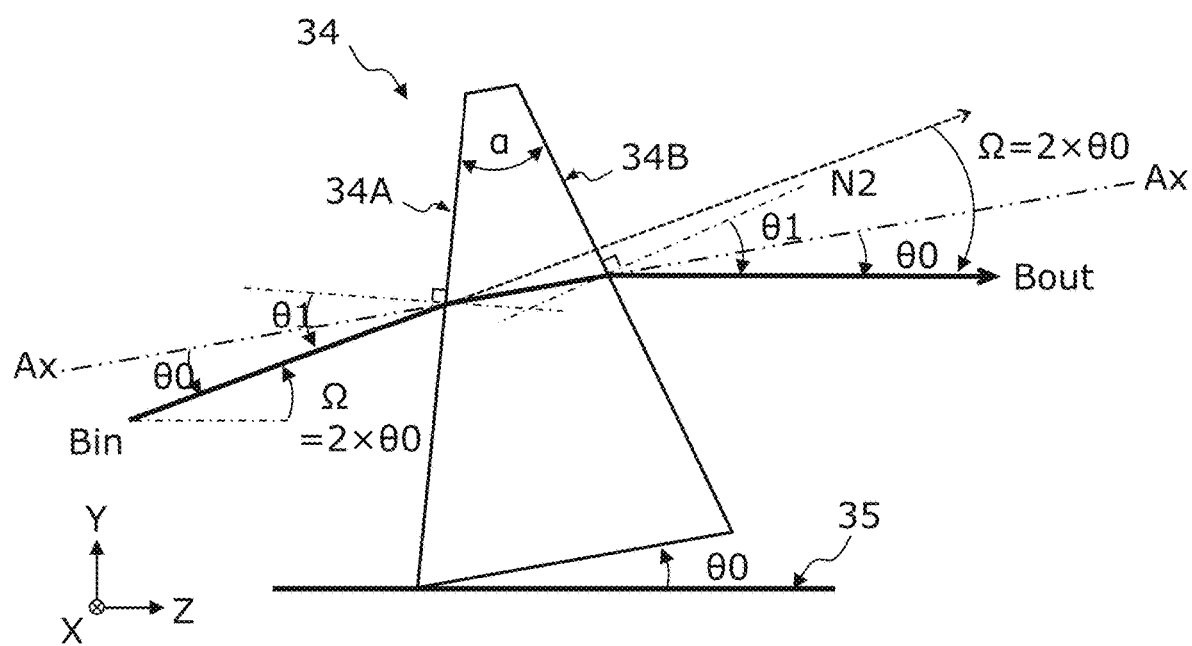
FIG. 19 is a diagram showing the wedge prism 34 being rotated around the X axis by an angle θ0.

FIG. 19 is a diagram showing the wedge prism 34 and the rays Bin and Bout as aforementioned being rotated around the X axis by the angle θ0. Through this rotation, the emitted ray Bout becomes parallel to the Z axis. Moreover, the angle that the incident ray Bin makes with the horizontal plane 35 becomes equal to 2×θ0.

As can be understood from the above, when the incident ray Bin is propagating in a direction that is inclined at the angle 2×θ0 with respect to the Z axis, i.e., when the angle of elevation Ω=2×θ0, employed the wedge prism 34 being rotated at the angle θ0 around the X axis allows the emitted ray Bout to be parallel to the Z axis.

The angle (angle of elevation Ω) at which the incident ray Bin is inclined with respect to the Z axis may be varied according to degree of misalignment of the fast-axis collimator lens FAC, as described above. Therefore, the tilt angle θ0 of the wedge prism 34 that is needed for optical path correction may differ for each individual light source unit 100X.

Moreover, as described above, correction of the azimuth angle Φ may be necessary in some cases. In such cases, as shown in FIG. 17C, the wedge prism 34 may be rotated around the Z axis, which allows both the angle of elevation Ω and the azimuth angle Φ to be sufficiently small. Usually, the angle of elevation Ω and the azimuth angle Φ both have small values of 1.0 degrees or less, and therefore, as shown in FIG. 17C, the wedge prism 34 does not need to be rotated at a large angle. Moreover, the azimuth angle Φ is usually small as compared to the angle of elevation Ω; therefore, after a correction is performed to make the angle of elevation Ω zero, the wedge prism 34 may only be slightly rotated to correct the azimuth angle Φ.

In certain embodiments of the present disclosure, when adjusting the propagation direction of the collimated beam B after performing alignment of the fast-axis collimator lens FAC and the slow-axis collimator lens SAC, the wedge prism 34 may be placed on the optical path and the tilt angle θ0 of the wedge prism 34 may be adjusted. Specifically, a plurality of wedge prisms 34 having different tilt angles θ0 may be provided in advance, and a wedge prism 34 that minimizes the angle of elevation A may be selected from among them. Then, the selected wedge prism 34 may be rotated around the Z axis to minimize the azimuth angle Φ. Thereafter, the position and orientation of the wedge prism 34 may be secured using an adhesive or a curable resin. The number of wedge prisms 34 to be provided may be e.g. seven, and their tilt angles θ0 may be e.g. 0.05, 0.1, 0.2, 0.3, 0.4, 0.5, and 1.0 degrees.

Figure 20:
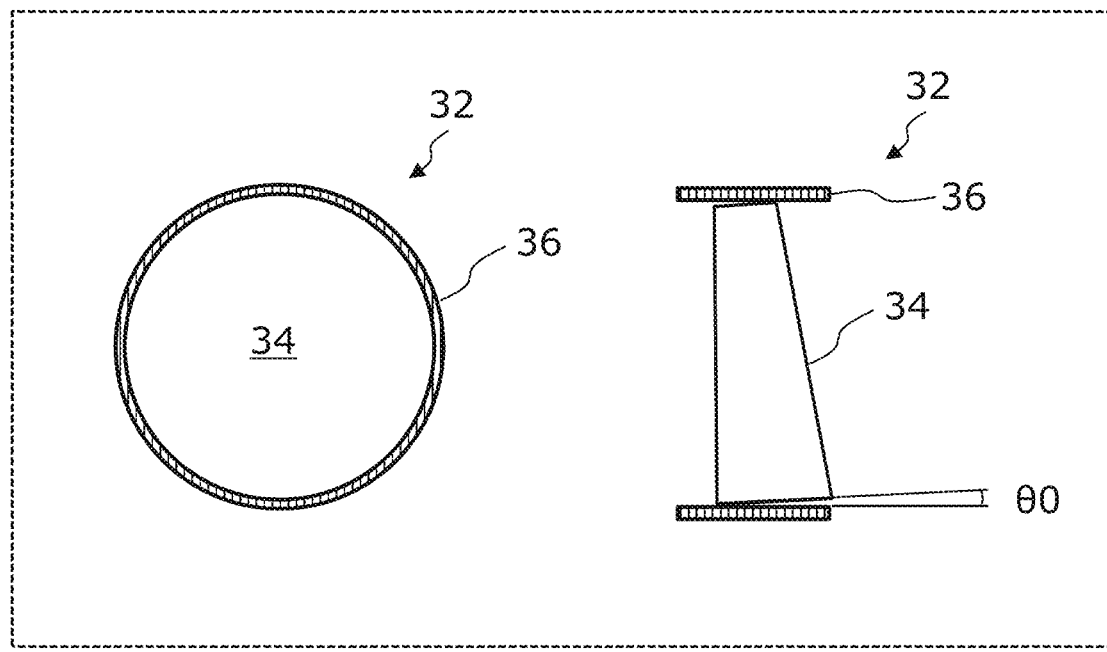
FIG. 20 is a diagram showing a front view and a cross-sectional view of an optical path correction element 32.
Figure 21:
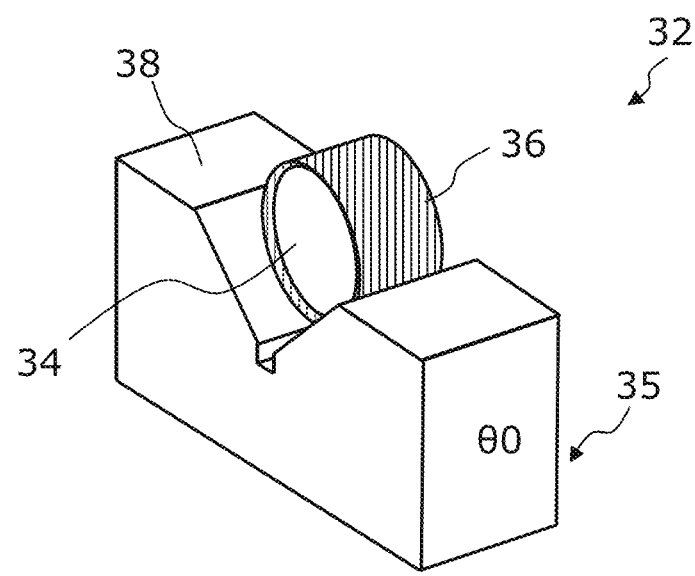
FIG. 21 is a perspective view showing an example structure for the optical path correction element 32.

FIG. 20 is a diagram showing an example structure of an optical path correction element 32 that is suitable for the aforementioned correction work. In FIG. 20, a front view of the optical path correction element 32 is shown on the left side, and a cross section of the optical path correction element 32 is shown on the right side. The optical path correction element 32 in FIG. 20 includes a cylinder (cylindrical holder) 36 and a circular wedge prism 34 that is secured at a tilt angle θ0 on the inside of the cylinder 36. The optical path correction element 32 as such may be secured to a supporting base 38 as shown in FIG. 21. The supporting base 38 defines a recess in which a portion of the wedge prism 34, surrounded by the cylinder 36, is disposed. In the example of FIG. 21, this recess is a groove with a substantially V-shaped cross section. With such a V-shaped groove, the aforementioned rotation of the wedge prism 34 around the Z axis can be easily made.

Figure 22:
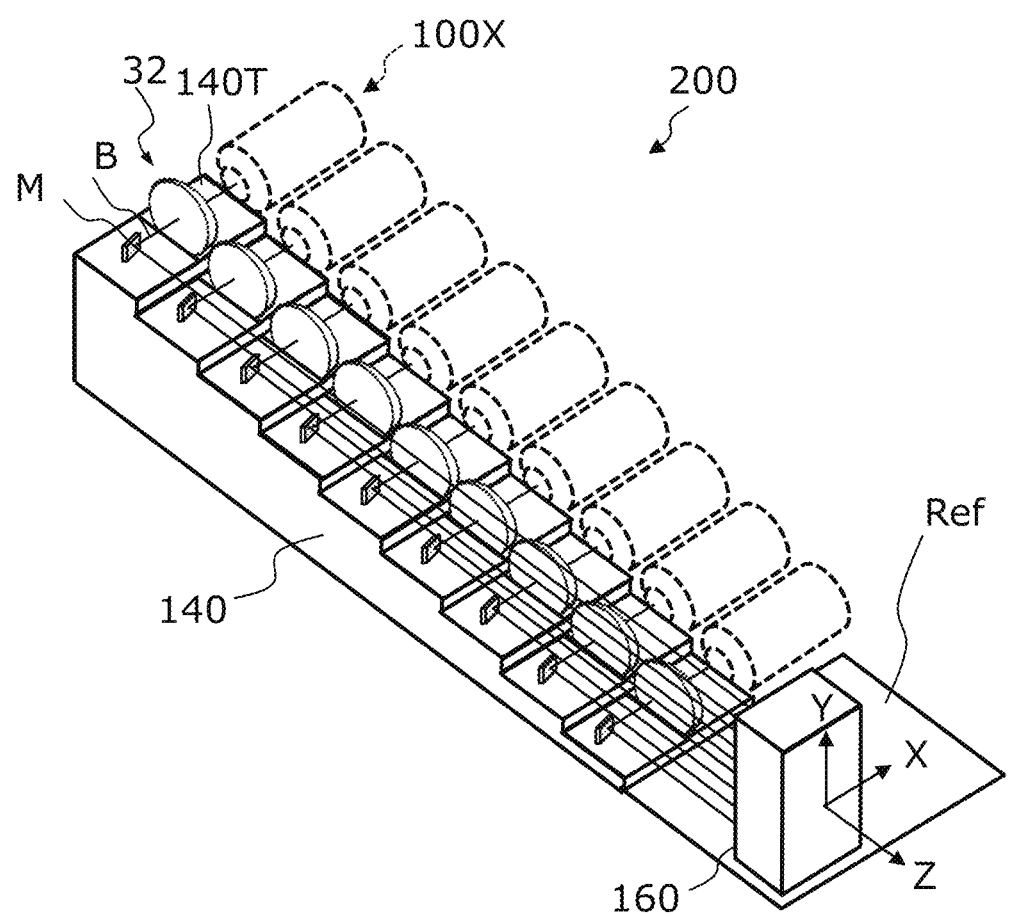
FIG. 22 is a perspective view schematically showing another example structure including a plurality of light source units 100X that include optical path correction elements 32.

FIG. 22 is a perspective view showing an example structure of a laser light source module 200 that includes a plurality of light source units 100X. The laser light source module 200 differs from the laser light source module 200 in FIG. 8 in that each light source unit 100X includes the optical path correction element 32, but other configurations of the laser light source module 200 is similar to those in the laser light source module 200 in FIG. 8.

While each light source unit 100X in the example shown in FIG. 22 includes the optical path correction element 32, any other appropriate configurations may be employed in embodiments of the present disclosure. When the light source unit 100X does not need optical path correction, the light source unit 100X does not need to include the optical path correction element 32. In the case where each of the plurality of light source units 100X includes the optical path correction element 32, the degree of the tilt angle θ0 of each optical path correction element 32 may differ in accordance with the required degree of correction.

While detailed description is omitted from FIG. 22 for simplicity, a recess is defined in the supporting surface 140T of the support 140 in which the wedge prism 34 for each optical path correction element 32 is disposed. The outer periphery of the wedge prism 34 may be surrounded by a member such as a cylinder, as necessary. In the example of FIG. 22, each optical path correction element 32 is secured to the support 140.

In the laser light source module 200 in FIG. 22, the collimated beams B can be properly incident on the convergent optical system 160, so that optical coupling with an optical fiber (not shown) can be performed with a higher efficiency.

A light source unit according to the present disclosure may be used for various applications in which the size of a collimated beam or a converged beam needs to be reduced. In particular, the light source unit according to the present disclosure may be used in combining a plurality of laser beams to realize a high-power laser beam. The laser diode of the light source unit may be a surface-emitting laser diode such, e.g., a vertical cavity surface emitting laser (VCSEL), as well as an end-emitting laser diode. The laser light source module and direct diode laser device according to the present disclosure may be used in fields of industry where high-power laser light sources are needed, e.g., cutting or punching of various materials, local heat treatments, surface treatments, metal welding, 3D printing, and so on. Furthermore, the laser light source module according to the present disclosure may also be used for applications other than DDL devices, e.g., as a pumping light source in a fiber laser device.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A light source unit comprising:
a sealed semiconductor laser package comprising:
    a laser diode including an emitter region from which laser light is emitted, the emitter region located at a surface of the laser diode, and
    a window member configured to transmit the laser light;
a first lens structure configured to receive the laser light transmitted through the window member and create an image of the emitter region on an image plane; and
a second lens structure configured to convert the laser light that has passed through the image plane into a collimated or converged beam, and to emit the collimated or converged beam;
wherein a distance between the image plane and the second lens structure is shorter than a distance between the emitter region of the laser diode and an outer surface of the window member.

2. The light source unit according to claim 1, wherein the first lens structure comprises an objective lens structure and an imaging lens structure.

3. The light source unit according to claim 2, wherein:
the emitter region of the laser diode is located at a front focal point of the objective lens structure;
the image plane is located at a back focal point of the imaging lens structure; and
an effective focal length of the imaging lens structure is equal to or greater than an effective focal length of the objective lens structure.

4. The light source unit according to claim 2, wherein each of the objective lens structure and the imaging lens structure is a compound lens.

5. The light source unit according to claim 1, wherein:
the second lens structure comprises a fast-axis collimator lens and a slow-axis collimator lens that are located in this order from the image plane; and
the distance between the image plane and the second lens structure is a distance between the image plane and the fast-axis collimator lens.

6. A light source unit comprising:
a sealed semiconductor laser package comprising:
    a laser diode including an emitter region from which laser light is emitted, the emitter region located at a surface of the laser diode, and
    a window member configured to transmit the laser light;
a first lens structure configured to receive the laser light transmitted through the window member and create an image of the emitter region on an image plane; and
a second lens structure configured to convert the laser light that has passed through the image plane into a collimated or converged beam, and to emit the collimated or converged beam;
wherein a distance between the image plane and the second lens structure is 1.0 millimeter or less.

7. The light source unit according to claim 1, wherein:
the second lens structure comprises a fast-axis collimator lens and a slow-axis collimator lens that are located in this order from the image plane;
an effective focal length of the fast-axis collimator lens is 1.0 millimeter or less; and
a fast-axis size of the collimated beam is 1.0 millimeter or less.

8. The light source unit according to claim 1, further comprising an optical path correction element that changes a propagation direction of the collimated beam emitted from the second lens structure.

9. The light source unit according to claim 1, wherein the optical path correction element comprises an optical member that refracts the collimated beam.

10. The light source unit according to claim 9, wherein the optical member is a wedge prism.

11. The light source unit according to claim 10, further comprising a base supporting the wedge prism, the base defining a recess in which a portion of the wedge prism is disposed.

12. The light source unit according to claim 6, wherein the first lens structure comprises an objective lens structure and an imaging lens structure.

13. The light source unit according to claim 12, wherein:
the emitter region of the laser diode is located at a front focal point of the objective lens structure;
the image plane is located at a back focal point of the imaging lens structure; and
an effective focal length of the imaging lens structure is equal to or greater than an effective focal length of the objective lens structure.

14. The light source unit according to claim 12, wherein each of the objective lens structure and the imaging lens structure is a compound lens.

15. The light source unit according to claim 6, wherein:
the second lens structure comprises a fast-axis collimator lens and a slow-axis collimator lens that are located in this order from the image plane; and
the distance between the image plane and the second lens structure is a distance between the image plane and the fast-axis collimator lens.

16. The light source unit according to claim 6, wherein:
the second lens structure comprises a fast-axis collimator lens and a slow-axis collimator lens that are located in this order from the image plane;
an effective focal length of the fast-axis collimator lens is 1.0 millimeter or less; and a fast-axis size of the collimated beam is 1.0 millimeter or less.

17. The light source unit according to claim 6, further comprising an optical path correction element that changes a propagation direction of the collimated beam emitted from the second lens structure.

18. The light source unit according to claim 6, wherein the optical path correction element comprises an optical member that refracts the collimated beam.

19. The light source unit according to claim 14, wherein the optical member is a wedge prism.

20. The light source unit according to claim 15, further comprising a base supporting the wedge prism, the base defining a recess in which a portion of the wedge prism is disposed.

* * * * *